（12) United States Patent
Harada et al.

(10) Patent No.: US 8,436,366 B2
(45) Date of Patent: May 7, 2013

(54) SUBSTRATE COMPOSED OF SILICON CARBIDE WITH THIN FILM, SEMICONDUCTOR DEVICE, AND METHOD OF MANUFACTURING A SEMICONDUCTOR DEVICE

(75) Inventors: Shin Harada, Itami (JP); Makoto Sasaki, Itami (JP); Takeyoshi Masuda, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 20 days.

(21) Appl. No.: 13/131,369

(22) PCT Filed: Apr. 6, 2010

(86) PCT No.: PCT/JP2010/056206
§ 371 (c)(1),
(2), (4) Date: May 26, 2011

(87) PCT Pub. No.: WO2010/119792
PCT Pub. Date: Oct. 21, 2010

(65) Prior Publication Data
US 2011/0233562 A1    Sep. 29, 2011

(30) Foreign Application Priority Data
Apr. 15, 2009   (JP) .................................. 2009-098793

(51) Int. Cl.
*H01L 29/15* (2006.01)
*H01L 29/04* (2006.01)

(52) U.S. Cl.
USPC .............. 257/77; 257/627; 438/974; 438/931

(58) Field of Classification Search .................. None
See application file for complete search history.

(56) References Cited

U.S. PATENT DOCUMENTS

| | | | |
|---|---|---|---|
| 6,734,461 B1 * | 5/2004 | Shiomi et al. | .................. 257/77 |
| 7,422,634 B2 | 9/2008 | Powell et al. | |
| 2004/0134418 A1 * | 7/2004 | Hirooka | .................. 117/101 |
| 2007/0032002 A1 * | 2/2007 | Nonaka et al. | ............... 438/192 |
| 2009/0242899 A1 * | 10/2009 | Zhang | .................. 257/77 |

FOREIGN PATENT DOCUMENTS

| | | |
|---|---|---|
| JP | 2008-227534 | 9/2008 |
| WO | 2009/003100 | 12/2008 |
| WO | WO 2009/003100 | * 12/2008 |
| WO | WO 2009003100 A1 | * 12/2008 |

* cited by examiner

*Primary Examiner* — Julio J Maldonado
*Assistant Examiner* — Harpreet Singh
(74) *Attorney, Agent, or Firm* — Drinker Biddle & Reath LLP

(57) ABSTRACT

A substrate achieving suppressed deterioration of processing accuracy of a semiconductor device due to bending of the substrate, a substrate with a thin film and a semiconductor device formed with the substrate above, and a method of manufacturing the semiconductor device above are obtained. A substrate according to the present invention has a main surface having a diameter of 2 inches or greater, a value for bow at the main surface being not smaller than −40 μm and not greater than −5 μm, and a value for warp at the main surface being not smaller than 5 μm and not greater than 40 μm. Preferably, a value for surface roughness Ra of the main surface of the substrate is not greater than 1 nm and a value for surface roughness Ra of a main surface is not greater than 100 nm.

14 Claims, 10 Drawing Sheets

US 8,436,366 B2

SUBSTRATE COMPOSED OF SILICON CARBIDE WITH THIN FILM, SEMICONDUCTOR DEVICE, AND METHOD OF MANUFACTURING A SEMICONDUCTOR DEVICE

TECHNICAL FIELD

The present invention relates to a substrate, a substrate with a thin film, a semiconductor device, and a method of manufacturing a semiconductor device, and more particularly to a substrate achieving suppressed deterioration of processing accuracy of a semiconductor device due to bending of the substrate, a substrate with a thin film and a semiconductor device formed with the substrate above, and a method of manufacturing the semiconductor device above.

BACKGROUND ART

For example, a technique for forming a semiconductor device by forming a thin-film stack structure on one main surface of a substrate composed of a semiconductor (semiconductor substrate) has generally been made use of. It is noted that the main surface herein refers to a largest, major surface of surfaces, and particularly in a case of a substrate, it refers to a surface on which a semiconductor device is to be formed.

In order to improve processing accuracy of a semiconductor device to be formed, preferably, the main surface of the substrate is flat and bent to a lesser extent. If the main surface of the substrate is flat, dimension accuracy and form accuracy of a pattern of the semiconductor device to be formed can be enhanced. For example, Patent Document 1 shown below discloses a single-crystal substrate of silicon carbide in which bending at the main surface is lessened.

PRIOR ART DOCUMENTS

Patent Documents

Patent Document 1: U.S. Pat. No. 7,422,634 B2

SUMMARY OF THE INVENTION

Problems to be Solved by the Invention

In forming a semiconductor device, normally, an epitaxial layer made of a semiconductor material is initially formed on one main surface of a semiconductor substrate. Then, a thin film of metal or an insulating film forming the semiconductor device is formed on one main surface of the epitaxial layer, that is, on a main surface opposite to a main surface facing the substrate. Then, the formed thin film is patterned in a desired shape, for example, by using a photolithography technique.

In performing the photolithography process, an exposure apparatus such as a stepper is employed, and the substrate is sucked by vacuum chuck of a back surface of the semiconductor substrate. Here, if the substrate having a thin film formed is bent in a direction along the main surface, it becomes difficult to evenly suck the substrate in the direction along the bent main surface. If the photolithography process is performed while the substrate is not evenly sucked but in an unstable state, an edge portion of a pattern of the thin film forming the semiconductor device is not formed by patterning stably at one location and a pattern having exposure variation having a certain width may be caused. Formation of such a pattern having exposure variation may affect electrical characteristics or the like of the semiconductor device to be formed. Therefore, in the substrate having a thin film formed thereon, preferably, bending in the direction along the main surface is less and the main surface is flat.

Namely, though it is also important that the main surface of the semiconductor substrate not having an epitaxial layer or a thin film formed is flat, preferably, bending of the main surface of the substrate is less and the main surface is flat while an epitaxial layer or a thin film forming the semiconductor device is formed on the main surface of the semiconductor substrate. Alternatively, a shape allowing correction of bending of the substrate is preferred, such that suction force by vacuum chuck can substantially evenly be applied to the substrate. Though Patent Document 1 discloses a single-crystal substrate of silicon carbide less in bending of the main surface, it fails to disclose bending of the substrate in which an epitaxial layer or a thin film is formed on the main surface.

For example, even when the substrate disclosed in Patent Document 1 has a flat main surface low in a degree of bending while an epitaxial layer or a thin film is not formed on the main surface, bending in the direction along the main surface may become greater while an epitaxial layer or a thin film is formed on the main surface of the substrate. This is because the substrate may bend in the direction along the main surface due to influence by heat or stress applied to the substrate in a process for forming an epitaxial layer or a thin film. Thus, it is unclear whether or not the substrate disclosed in Patent Document 1 has a degree of flatness required in photolithography.

The present invention was made in view of the problems above, and an object of the present invention is to provide a substrate achieving suppressed deterioration of processing accuracy of a semiconductor device due to bending of the substrate, a substrate with a thin film and a semiconductor device formed with the substrate above, and a method of manufacturing the semiconductor device above.

Means for Solving the Problems

Here, terms for expressing a degree of bending at the main surface of the substrate will be described. FIG. 1(A) is a schematic cross-sectional view of a substrate according to an embodiment of the present invention. FIG. 1(B) is a schematic diagram schematically illustrating a three-point focal plane and a central portion in a main surface of the substrate shown in FIG. 1(A). FIG. 1(C) is a schematic cross-sectional view schematically illustrating a value for warp, a value for bow, and a value for sori at the main surface of the substrate shown in FIG. 1(A). It is noted that FIG. 1(C) draws only one main surface 1a of the substrate shown in FIG. 1(A).

Warp represents the following dimension. Initially, an average value of heights (height in a vertical direction shown in the cross-sectional view in FIG. 1(A)) at three points (a three-point focal plane 11) shown in FIG. 1(B) on main surface 1a of a substrate 1 which is not clamped is defined as a reference height (a three-point focal plane height 12). It is noted that the three-point focal plane is present in a region on main surface 1a close to an outer edge. A total value of distances between a highest point 13 having the greatest height shown in FIG. 1(C) and a lowest point 14 at this time is defined as warp. A value of warp representing a distance always takes a positive value. Though three-point focal plane height 12 is arranged at a portion lower than actual in FIG. 1(C), it is done so for facilitated view of the drawings for the sake of illustration.

In addition, bow represents a value indicating a coordinate of a height on main surface 1a, of a central portion 15 with respect to a coordinate of the average value of three-point focal plane height 12, at central portion 15 of main surface 1a shown in FIG. 1(B). Here, the upper side in FIG. 1(A) is assumed as a positive coordinate. Therefore, a value for bow can take any of positive and negative values, depending on a direction of bending of main surface 1a. For example, as shown in FIG. 1(C), at central portion 15, main surface 1a (substrate 1) in a shape convex downward in the cross-sectional view is low in height on main surface 1a, with respect to the height of three-point focal plane 11. Therefore, when the main surface is in a shape convex downward, a value for bow is negative. In contrast, when main surface 1a (substrate 1) is in a shape convex upward, a value for bow is positive.

Sori represents a total value of distances between highest point 13 and lowest point 14 indicated in main surface 1a in an example where a least square plane of main surface 1a of substrate 1 shown in the cross-sectional view in FIG. 1(A) is assumed as the reference height (a least square plane height 16). Since sori also represents a distance, a value thereof is always positive as in the case of warp.

With reference to the above, a substrate according to one aspect of the present invention is a substrate composed of silicon carbide, having a main surface having a diameter of 2 inches or greater, a value for bow at the main surface being not smaller than −40 μm and not greater than −5 μm, and a value for warp at the main surface being not smaller than 5 μm and not greater than 40 μm.

In forming a thin film made of a material other than silicon carbide, such as metal or an insulating film, on one main surface of a substrate composed of silicon carbide or of a substrate with a thin film in which an epitaxial layer (thin film) composed, for example, of silicon carbide is formed on one main surface of the substrate composed of silicon carbide, tensile stress is applied to the substrate (or the substrate with a thin film). As a result of applied tensile stress, the substrate deforms to bend in a direction convex upward when the substrate (or the substrate with a thin film) is viewed in cross-section with the main surface on the thin-film formation side being assumed as the upper side. In order to suck the substrate in a stable manner in a photolithography process which is a post-process, the substrate is preferably moderately bent in the direction convex upward.

Therefore, in forming a thin film made of a material other than silicon carbide on the substrate (or the substrate with a thin film), in a stage of a substrate not having a thin film formed thereon, which is a step prior to formation of a thin film made of a material other than silicon carbide, the substrate is preferably moderately bent in a direction convex downward. Thus, in forming a thin film made of a material other than silicon carbide on the substrate (or the substrate with a thin film), excessive bending of the substrate in the direction convex upward can be suppressed by moderately bending the substrate in the direction convex upward. To that end, in the stage of the substrate not having a thin film formed thereon, a range of optimal values of bending of the substrate in the direction convex downward is preferably within a range represented by bow or warp above. In addition, correction of bending of the substrate in the direction convex downward due to suction force is more difficult than correction of bending in the direction convex upward. Therefore, optimal values are present also as a precaution against a case where a photolithography process is performed prior to formation of a thin film made of a material other than silicon carbide.

By doing so, a value for bow or warp of the substrate with a thin film, in which an epitaxial layer of silicon carbide or a thin film of metal or an insulating film is formed on one main surface of the substrate, can be set to a value attaining moderate bending in the direction convex upward, that allows the substrate to be sucked in a stable manner in performing the photolithography process which is a post-process. Therefore, occurrence of such defects as exposure variation in a formed pattern can be suppressed.

In the substrate above, preferably, a value for surface roughness Ra of one main surface is not greater than 1 nm and a value for surface roughness Ra of the other main surface opposed to one main surface is not greater than 100 nm.

If the value for surface roughness Ra of the main surface of the substrate having a value for bow or warp in the range above is small, a value for bow or warp of the substrate with a thin film in which a thin film is formed on one main surface of the substrate above can more reliably be set to a value attaining moderate bending in the direction convex upward, that allows the substrate to be sucked in a stable manner in performing the photolithography process which is a post-process. Therefore, occurrence of such defects as exposure variation in a formed pattern can more reliably be suppressed.

In the substrate above, preferably, a value for TTV at the main surface is not greater than 5 μm. As will be described later, TTV is a value indicating variation (deviation) in thickness of the substrate in each region. Namely, by making the value for TTV smaller, a substrate having thickness distribution closer to uniform can be obtained. If a value for bow or warp at the main surface is within the range described above in the substrate having thickness distribution close to uniform, the substrate can be sucked in a more stable manner.

In the substrate above, preferably, an angle between the main surface and a C plane is not smaller than 50° and not greater than 65°. Thus, an insulated gate transistor (MOSFET, MISFET) having high channel mobility is obtained.

A substrate according to another aspect of the present invention is a substrate with a thin film, which includes a substrate composed of silicon carbide and having a main surface having a diameter of 2 inches or greater and a thin film composed of silicon carbide and formed on one main surface of the substrate above. It is a substrate with a thin film, in which a value for bow at the main surface above is not smaller than −40 μm and not greater than 0 μm and a value for warp at the main surface above is not smaller than 0 μm and not greater than 40 μm.

As described above, if a thin film made of a material other than silicon carbide is formed on one main surface of the substrate, the substrate deforms to bend in a direction convex upward, with the main surface on the thin-film formation side being assumed as the upper side. Therefore, in the substrate with a thin film having a thin film of silicon carbide formed thereon, which is a stage prior to the step of forming a thin film made of a material other than silicon carbide, the main surface of the substrate is preferably moderately bent in a direction convex downward. To that end, in the stage of the substrate with a thin film having a thin film of silicon carbide formed thereon but not having a thin film made of a material other than silicon carbide formed thereon, a range of optimal values of bending of the substrate in the direction convex downward is preferably within the range represented by bow or warp above.

A value for bow or warp of the substrate with a thin film, in which a thin film of metal or an insulating film is formed on one main surface of the thin film, can be set to a value attaining moderate bending in the direction convex upward, that allows the substrate to be sucked in a stable manner in performing the photolithography process which is a post-process. Therefore, occurrence of such defects as exposure variation in a formed pattern can be suppressed.

In the substrate with a thin film above as well, as in the substrate not having a thin film formed thereon, preferably, a value for surface roughness Ra of one main surface of the substrate is not greater than 1 nm and a value for surface roughness Ra of the other main surface opposed to one main surface is not greater than 100 nm.

A substrate according to yet another aspect of the present invention is a substrate with a thin film, which includes a substrate composed of silicon carbide and having a main surface having a diameter of 2 inches or greater, a thin film composed of silicon carbide and formed on one main surface above, and a thin film composed of a material other than silicon carbide and formed on a main surface of the thin film composed of silicon carbide above, which is not opposed to the substrate. A value for bow at the main surface above is not smaller than 0 μm and not greater than 150 μm and a value for warp at the main surface above is not smaller than 0 μm and not greater than 150 μm.

As described above, in order to achieve stable suction of the substrate in the photolithography process which is a post-process of the step of forming a thin film, the substrate is preferably moderately bent in the direction convex upward. A range of values for bow or warp in the substrate moderately bent in the direction convex upward is the range of the values above. If a value for bow or warp is within the range above, the substrate can be sucked in a stable manner in performing the photolithography process which is a post-process. Therefore, occurrence of such defects as exposure variation in a formed pattern can be suppressed.

In the substrate with a thin film described above, further preferably, a value for bow at the main surface is not smaller than 0 μm and not greater than 100 μm and a value for warp is not smaller than 0 μm and not greater than 100 μm. Here, the substrate can be sucked in a more stable manner in performing the photolithography process which is a post-process. Therefore, occurrence of such defects as exposure variation in a formed pattern can more reliably be suppressed.

In the substrate with a thin film above as well, preferably, a value for surface roughness Ra of one main surface of the substrate is not greater than 1 nm and a value for surface roughness Ra of the other main surface opposed to one main surface is not greater than 100 nm, as in the substrate not having a thin film formed thereon.

In the substrate with a thin film described above as well, preferably, a value for TTV at the main surface of the substrate is not greater than 5 μm. In addition, preferably, an angle between the main surface of the substrate and a C plane is not smaller than 50° and not greater than 65°.

A semiconductor device including the substrate or the substrate with a thin film described above is formed by performing patterning while the substrate is sucked in a stable manner. Therefore, a high-quality semiconductor device free from such defects as exposure variation can be provided.

A method of manufacturing a semiconductor device according to the present invention is a method of manufacturing a semiconductor device including the steps of preparing a substrate composed of silicon carbide and having a main surface having a diameter of 2 inches or greater, forming a thin film composed of silicon carbide on one main surface of the substrate, and forming a thin film composed of a material other than silicon carbide on a main surface of the thin film above, which is not opposed to the substrate. In the step of preparing a substrate, the substrate is prepared such that a value for bow at the main surface is not smaller than −40 μm and not greater than 0 μm and a value for warp at the main surface is not smaller than 0 μm and not greater than 40 μm. In the step of forming a thin film composed of silicon carbide, the thin film composed of silicon carbide is formed such that a value for bow at the main surface of the substrate is not smaller than −40 μm and not greater than 0 μm and a value for warp at the main surface of the substrate is not smaller than 0 μm and not greater than 40 μm. In the step of forming a thin film composed of a material other than silicon carbide, a thin film composed of a material other than silicon carbide is formed such that a value for bow at the main surface of the substrate is not smaller than 0 μm and not greater than 150 μm and a value for warp at the main surface of the substrate is not smaller than 0 μm and not greater than 150 μm.

By setting respective values for bow and warp at the main surface in a state of the substrate composed of silicon carbide and respective values for bow and warp at the main surface of the substrate in a state that a thin film made of silicon carbide is formed on one main surface of the substrate within the range described above in manufacturing a semiconductor device, respective values for bow and warp at the main surface of the substrate, in which a thin film made of a material other than silicon carbide is further formed, can be set within the range above. Here, the substrate is moderately bent in the direction convex upward. By thus bending the main surface of the substrate, in which a thin film made of a material other than silicon carbide is formed, moderately in the direction convex upward, the substrate can be sucked in a stable manner in the photolithography process subsequent to the step of forming the thin film above. Therefore, occurrence of such defects as exposure variation in a formed pattern can be suppressed.

In the step of preparing a substrate above, preferably, the substrate is prepared such that a value for surface roughness Ra of one main surface of the main surfaces of the substrate is not greater than 1 nm and a value for surface roughness Ra of the other main surface opposed to one main surface above is not greater than 100 nm.

Preferably, a thin film of metal or an insulating film is formed as the thin film composed of a material other than silicon carbide described above. These thin film of metal and insulating film are formed on the main surface of the substrate as components such as an electrode and an insulating film forming a semiconductor device formed on one main surface of the substrate composed of silicon carbide. In particular, preferably, the metal above is tungsten and the insulating film above is a silicon oxide film.

Effects of the Invention

According to the present invention, a substrate achieving suppressed deterioration of processing accuracy of a semiconductor device due to bending of the substrate, a substrate with a thin film and a semiconductor device formed with the substrate above, and a method of manufacturing the semiconductor device above can be provided.

MODES FOR CARRYING OUT THE INVENTION

Figure 1:
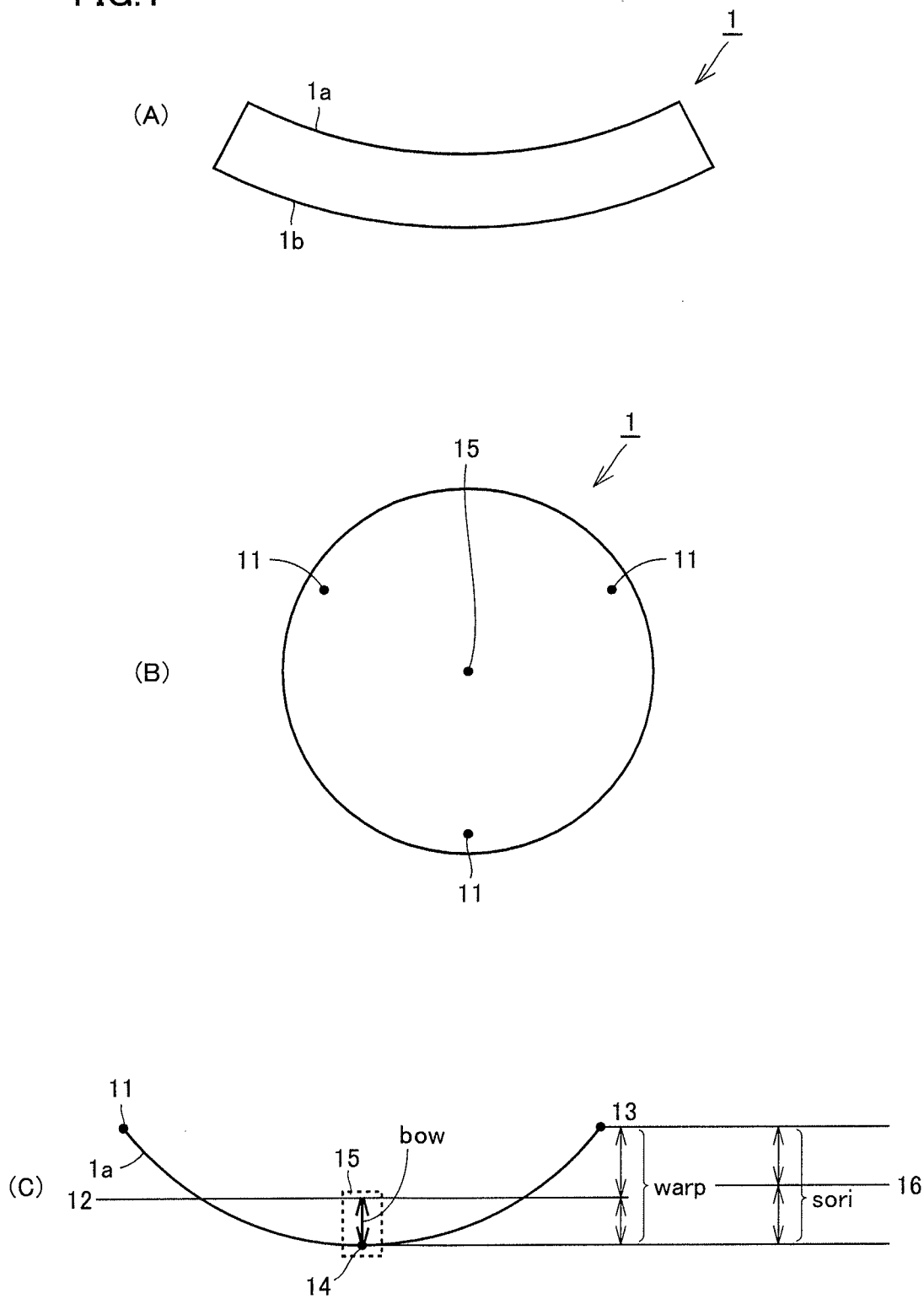
FIG. 1(A) is a schematic cross-sectional view of a substrate according to an embodiment of the present invention.
FIG. 1(B) is a schematic diagram schematically illustrating a three-point focal plane and a central portion in a main surface of the substrate shown in FIG. 1(A)
FIG. 1(C) is a schematic cross-sectional view schematically illustrating a value for warp, a value for bow, and a value for sori at the main surface of the substrate shown in FIG. 1(A).

Each embodiment of the present invention will be described hereinafter with reference to the drawings. In each embodiment, an element having the same function has the same reference character allotted and description thereof will not be repeated unless particularly required.

Referring to FIG. 1(A), substrate 1 according to the embodiment of the present invention is a substrate composed of silicon carbide and having main surface 1a and main surface 1b each having a diameter of 2 inches or greater. In addition, a value for bow at main surface 1a, 1b is not smaller than −40 μm and not greater than −5 μm and a value for warp at main surface 1a, 1b is not smaller than 5 μm and not greater than 40 μm. In the following, a side where main surface 1a is present is assumed as the upper side, and a thin film or a semiconductor device is formed on main surface 1a. Since a value for bow is a negative value, substrate 1 has a shape convex downward as shown in FIG. 1(A).

Figure 2:
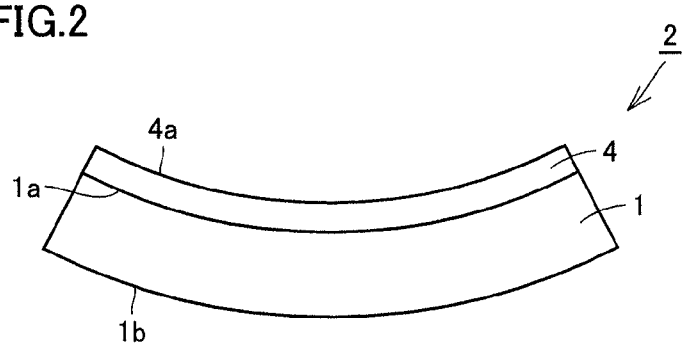
FIG. 2 is a schematic cross-sectional view of a substrate with a thin film, in which a thin film composed of silicon carbide is formed on one main surface of the substrate according to the embodiment of the present invention.
Figure 3:
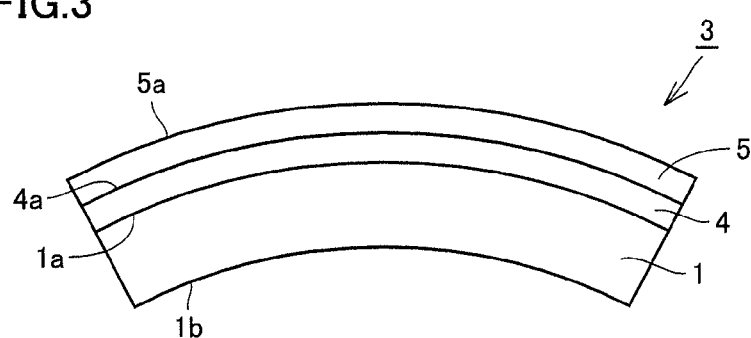
FIG. 3 is a schematic cross-sectional view of a substrate with a thin film, in which a thin film composed of a material other than silicon carbide is formed on one main surface of the substrate in FIG. 2.

Substrate 1 composed of silicon carbide forms a substrate with a thin film 2 by forming a thin film composed, for example, of silicon carbide (a silicon-carbide thin film 4) through epitaxial growth on main surface 1a as shown in FIG. 2, for example, in forming a semiconductor device. In addition, as shown in FIG. 3, a substrate with a thin film 3 is formed by forming a thin film composed of a material other than silicon carbide (a non-silicon-carbide thin film 5) on a main surface 4a of silicon-carbide thin film 4 above, which is not opposed to substrate 1. A semiconductor device is formed by combining these silicon-carbide thin film 4 and non-silicon-carbide thin film 5 or patterning.

Here, as shown in FIGS. 1 and 2, in the step of forming silicon-carbide thin film 4 on substrate 1 through epitaxial growth, there is no significant change in a value for bow or warp at main surface 1a, 1b of substrate 1 before and after that step. This is because silicon-carbide thin film 4 is grown on main surface 1a of substrate 1 composed of silicon carbide, that is, substrate 1 and silicon-carbide thin film 4 are made from the same material, and hence difference in thermal expansion coefficient or lattice constant in a crystal structure forming both of them is small.

As can be seen from comparison among FIGS. 1, 2 and 3, however, substrate 1 that has been bent in the direction convex downward deforms to bend in the direction convex upward in the step of forming non-silicon-carbide thin film 5 on main surface 4a of the silicon-carbide thin film. This is because a thin film made of a material different from silicon carbide is formed on the main surface of silicon-carbide thin film 4 in the step of forming non-silicon-carbide thin film 5 and hence tensile stress originating from difference in thermal expansion coefficient between silicon-carbide thin film 4 and non-silicon-carbide thin film 5 or difference in lattice constant in a crystal structure forming both of them is generated.

Non-silicon-carbide thin film 5 is formed, for example, of a thin film of a metal or an insulating material for forming an electrode or an insulating film forming a semiconductor device. A desired semiconductor device is formed by patterning non-silicon-carbide thin film 5 so as to form a desired shape as a component forming the semiconductor device. To that end, in patterning non-silicon-carbide thin film 5 using, for example, a photolithography technique after formation of non-silicon-carbide thin film 5, substrate with a thin film 3 is suctioned from above a main surface 5a of non-silicon-carbide thin film 5, for example, by vacuum chuck.

Figure 4:
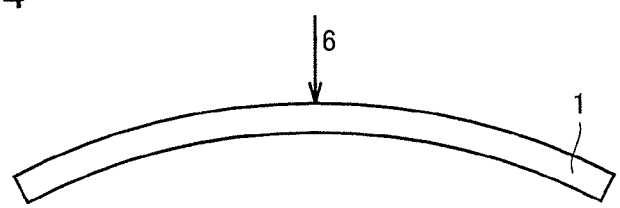
FIG. 4 is a schematic cross-sectional view showing a manner in which suction force is applied to the substrate bent convexly upward.
Figure 5:
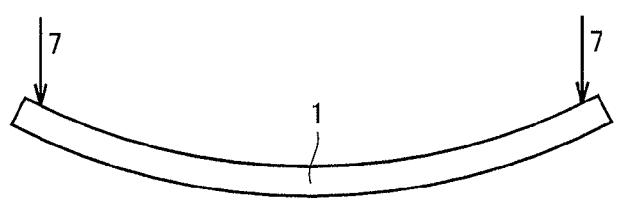
FIG. 5 is a schematic cross-sectional view showing a manner in which suction force is applied to the substrate bent convexly downward.

Here, for example, consider a case where suction force 6, for example, by vacuum chuck is applied to substrate 1 bent convexly upward as shown in FIG. 4 and a case where suction force 7 is similarly applied from above substrate 1 bent convexly downward as shown in FIG. 5. It is noted that substrate 1 not having a thin film formed is shown in FIGS. 4 and 5 for simplification of illustration.

For example, in a case where suction force 6 is applied from above substrate 1 bent convexly upward as shown in FIG. 4, suction force by vacuum chuck initially reaches the central portion of the main surface of substrate 1 and acts to correct and flatten the convex shape of the central portion of substrate 1. Here, a lower portion of substrate 1 is supported around the entire circumference by an outer edge portion of substrate 1. In addition, since it is only necessary to apply suction force 6 solely onto one point of the convex-shaped central portion, suction force 6 can readily be received without such an unstable operation as tilting or displacement of a position in case of application of suction force 6 to substrate 1, with a state fixed at one location being maintained.

In contrast, for example, in a case where suction force 7 is applied from above substrate 1 bent convexly downward as shown in FIG. 5, if suction force 7 on the left and right sides shown in FIG. 5 is simultaneously and similarly applied to substrate 1, it acts to correct and flatten a concave shape of substrate 1. For example, however, if a state of bending of substrate 1 is asymmetrical, that is, for example, if application of suction force 7 on the left shown in FIG. 5 to substrate 1 starts before application of suction force 7 on the right, substrate 1 is tilted by left suction force 7 in such a manner that the left side moves downward and the right side moves upward. Namely, unless substantially uniform suction is achieved around the entire circumference of the outer edge portion of substrate 1, it is difficult to fix substrate 1 in a stable manner so as not to be tilted or not to experience position displacement. Therefore, it is difficult to correct bending of substrate 1 by applying suction force 7 from above substrate 1 bent convexly downward. From the foregoing, the substrate to be subjected to the photolithography process, that is, substrate with a thin film 3, in which silicon-carbide thin film 4 and non-silicon-carbide thin film 5 are formed, is preferably bent convexly upward, rather than bent convexly downward.

If a degree of bending convexly upward of substrate with a thin film 3 above is excessive, it becomes difficult to correct bending of substrate with a thin film 3 even with the use of suction force 6 shown in FIG. 4. Therefore, a tolerable range of a degree of bending convexly upward of substrate with a thin film 3 is present, and substrate with a thin film 3 is preferably bent convexly upward within that tolerable range. Thus, in order for substrate with a thin film 3 having silicon-carbide thin film 4 and non-silicon-carbide thin film 5 formed thereon to be in a state moderately bent convexly upward as described above, substrate 1 shown in FIG. 1 before formation of a thin film is preferably bent convexly downward within a moderate range. Here, in substrate 1 having main surface 1*a*, 1*b* having a diameter of 2 inches or greater, preferably, a value for bow at main surface 1*a*, 1*b* is not smaller than −40 µm and not greater than −5 µm and a value for warp is not smaller than 5 µm and not greater than 40 µm as described above. By doing so, substrate with a thin film 3 obtained by forming silicon-carbide thin film 4 and non-silicon-carbide thin film 5 on substrate 1 can moderately be bent convexly upward as described above.

As described above, substrate with a thin film 2 including substrate 1 and silicon-carbide thin film 4 formed on main surface 1*a* of substrate 1 shown in FIG. 2 is also preferably bent convexly downward within a moderate range, as in the case of substrate 1. Specifically, substrate 1 for substrate with a thin film 2 preferably has a value for bow at main surface 1*a* not smaller than −40 µm and not greater than 0 µm and a value for warp at main surface 1*a* not smaller than 0 µm and not greater than 40 µm. As described above, in the step of forming silicon-carbide thin film 4 on main surface 1*a* of substrate 1, such deformation as significant change in the direction of bending of substrate 1 does not occur. Therefore, the tolerable range of bow or warp at main surface 1*a* of substrate 1 for substrate with a thin film 2 is close to the tolerable range of bow or warp at main surface 1*a* of substrate 1 shown in FIG. 1. For example, however, in a process for epitaxial growth for forming silicon-carbide thin film 4, slight deformation may occur. Therefore, a smaller value for warp than that for substrate 1 is also tolerated. From the foregoing, the tolerable range of a value for bow or warp of substrate with a thin film 2 is slightly different from the tolerable range for substrate 1.

Regarding substrate with a thin film 3, in which non-silicon-carbide thin film 5 is further formed on main surface 4*a* of silicon-carbide thin film 4 forming substrate with a thin film 2, preferably, a value for bow at main surface 1*a* of substrate 1 is not smaller than 0 µm and not greater than 150 µm and a value for warp at main surface 1*a* is not smaller than 0 µm and not greater than 150 µm. Since the value for bow is positive, it can be said that substrate with a thin film 3 (as described above) as shown in FIG. 3 is preferably in a shape convex upward. Though substrate with a thin film 3 is preferably in a shape convex upward, a degree of bending of substrate with a thin film 3 is preferably as low as possible, because substrate with a thin film 3 is subjected to the photolithography process through application of suction force generated by vacuum chuck. Specifically, further preferably, a value for bow at main surface 1*a* of substrate 1 forming substrate with a thin film 3 is not smaller than 0 µm and not greater than 100 µm and a value for warp is not smaller than 0 µm and not greater than 100 µm. It is noted that a completely flat state, that is, a value for bow or warp being 0 µm, is further preferred.

Meanwhile, warp representing a degree of bending of main surface 1*a* of substrate 1 described above varies if a diameter of substrate 1 is different, for example, despite a curvature of main surface 1*a* being the same. Therefore, for example, in a case where substrate 1 having a large diameter is employed, a curvature of main surface 1*a* is preferably smaller, in order to make the value for warp smaller.

Substrate 1 shown in FIG. 1, substrate 1 for substrate with a thin film 2 shown in FIG. 2, and substrate 1 for substrate with a thin film 3 shown in FIG. 3 described above preferably have a value for surface roughness Ra of one main surface not greater than 1 nm and a value for surface roughness Ra of the other main surface opposed to one main surface not greater than 100 nm. It is noted that, in substrate 1, further preferably, a value for surface roughness Ra of main surface 1*a* on which a thin film is to be formed is not greater than 1 nm and a value for surface roughness Ra of main surface 1*b* on which a thin film is not to be formed is not greater than 100 nm.

As described above, since a thin film made of a material the same as that for substrate 1 is formed in forming silicon-carbide thin film 4 on substrate 1 composed of silicon carbide, deformation involved with bending of substrate 1 is small. Substrate 1, however, is placed in a heated atmosphere also in the step of forming silicon-carbide thin film 4, and therefore deformation due to thermal stress may occur. Specifically, for example, even if substrate 1 shown in FIG. 1 on which a thin film is not formed is bent in a shape convex downward, substrate with a thin film 2 having silicon-carbide thin film 4 formed may deform in a shape convex upward. If substrate with a thin film 3 is formed by further forming non-silicon-carbide thin film 5 in this state, substrate 1 originally in a shape convex upward deforms in a shape further convex upward due to tensile stress described above. Then, a value for warp or bow of substrate with a thin film 3 may be out of the tolerable range.

In order to suppress the phenomenon above, surface roughness Ra of main surface 1*a*, 1*b* of substrate 1 is preferably controlled within a desired range, as described above. By doing so, since crystallinity at main surface 1*a*, 1*b* of substrate 1 is substantially equally good, rearrangement or the like of crystal lattices due to heating can be suppressed. Consequently, significant change in a degree or a direction of bending of main surface 1*a*, 1*b* of substrate 1 before and after the step of forming a thin film can be suppressed.

Here, warp shown in FIG. 1(C) is defined as the sum of a difference in height between three-point focal plane height 12 and highest point 13 of main surface 1a of substrate 1 and a difference in height between three-point focal plane height 12 and lowest point 14 of main surface 1a of substrate 1, with three-point focal plane height 12 serving as the reference. In addition, a value for sori shown in FIG. 1(C) is defined as the sum of a difference in height between least square plane height 16 and highest point 13 of main surface 1a of substrate 1 and a difference in height between least square plane height 16 and lowest point 14 of main surface 1a of substrate 1, with least square plane height 16 serving as the reference. Therefore, as shown in FIG. 1(C), in many cases, values for warp and sori are equal to each other at main surface 1a of substrate 1 shown in FIG. 1 or substrate 1 in FIGS. 2 and 3. Thus, not only warp but also sori can be used as a numeric value for controlling bending of substrate 1.

Figure 6:
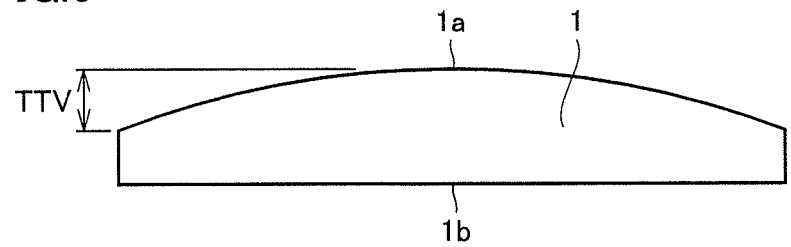
FIG. 6 is a schematic cross-sectional view illustrating TTV of the substrate according to the embodiment of the present invention.

TTV (Total Thickness Variation) of substrate 1 will now be considered. Initially, for example, attention is paid to a thickness, which is a distance between main surface 1a and main surface 1b of substrate 1. Here, it is assumed that one main surface of substrate 1 (for example, main surface 1b in FIG. 6) is a completely flat surface. Here, substrate 1 shown in FIG. 6 in which a position in each region of main surface 1a opposed to main surface 1b was determined to correspond to a thickness in each region of substrate 1 is considered. A difference between a thickness $T_1$ in a region greatest in thickness of substrate 1 shown in this FIG. 6 and a thickness $T_2$ in a region smallest in thickness represents variation in thickness of substrate 1. This variation in thickness is defined as TTV. Substrate 1 in FIG. 1 and substrate 1 in FIGS. 2 and 3 according to the present invention preferably have a value for TTV at main surface 1a shown in FIG. 6 not greater than 5 µm. Thus, substrate 1 having thickness distribution closer to uniform can be obtained. In substrate 1 having thickness distribution close to uniform, a shape or a degree of irregularities is similar between main surface 1a and main surface 1b. Therefore, for example, in forming silicon-carbide thin film 4 or non-silicon-carbide thin film 5, occurrence of such a phenomenon that a state of bending, a shape of a surface, or the like is significantly different between main surface 1a and main surface 1b of substrate 1 can be suppressed. More specifically, for example, occurrence of such a phenomenon that main surface 1a of substrate 1 is bent convexly upward, whereas main surface 1b is bent convexly downward can be suppressed. Thus, control of a state of bending of substrate 1 in FIG. 1 or substrate 1 in FIGS. 2 and 3 can be facilitated. Therefore, a degree of bending of substrate with a thin film 3 obtained by forming silicon-carbide thin film 4 and non-silicon-carbide thin film 5 on substrate 1 can readily be controlled such that the substrate is moderately bent convexly upward as described above.

Figure 7:
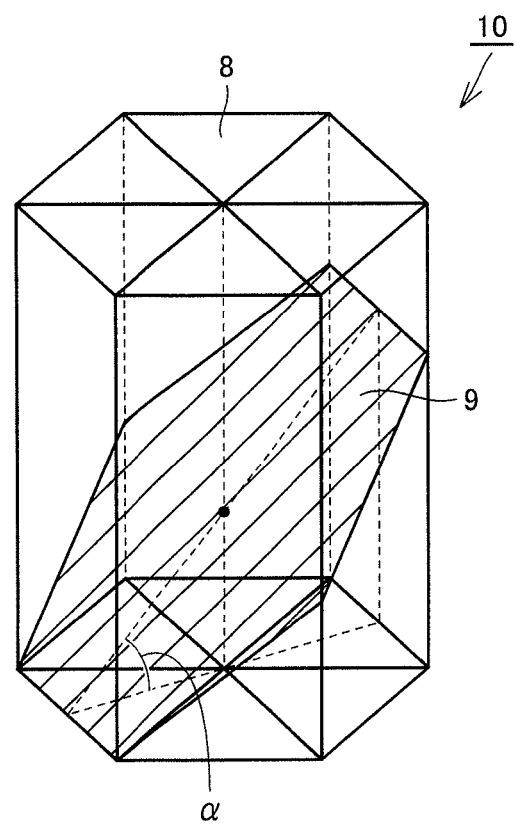
FIG. 7 is a schematic diagram of a crystal structure illustrating a direction of a crystal plane of the substrate according to the embodiment of the present invention.

An angle between main surface 1a, 1b of substrate 1 in FIGS. 1, 2 and 3 described above and a C plane is preferably not smaller than 50° and not greater than 65°. Here, the C plane refers to a (0001) plane 8 indicating a horizontal plane with respect to the vertical direction of a hexagonal crystal 10 exhibiting a crystal structure of silicon carbide shown in FIG. 7. An angle α between a crystal plane 9 shown in FIG. 7 and (0001) plane 8 is assumed as 50° or greater and 65° or smaller. Here, crystal plane 9 is preferably equal to a plane direction of main surface 1a, 1b of substrate 1 described above. Thus, an insulated gate transistor (MOSFET, MISFET) having high channel mobility is obtained.

A method of manufacturing a semiconductor device including substrate 1 described above will now be described. As shown in the flowchart in FIG. 8, the method of manufacturing a semiconductor device according to the embodiment of the present invention includes the step of preparing a substrate (S10), the step of forming a thin film composed of silicon carbide (S20), the step of forming a thin film composed of a material other than silicon carbide (S30), and a subsequent step of forming a semiconductor device (S40).

In the step of preparing a substrate (S10), substrate 1 composed of silicon carbide and having main surface 1a, 1b having a diameter of 2 inches or greater as shown in FIG. 1(A) is prepared. Here, substrate 1 is preferably prepared such that a value for bow at main surface 1a, 1b of substrate 1 is not smaller than −40 µm and not greater than 0 µm and a value for warp at main surface 1a, 1b is not smaller than 0 µm and not greater than 40 µm.

In order to form substrate 1, initially, an ingot composed of silicon carbide is fabricated, for example, by using a sublimation-recrystallization method or a high-temperature CVD method. Here, a main surface of the ingot has a diameter preferably greater than a diameter of the main surface of substrate 1 to desirably be formed. It is noted that the main surface of the aforementioned ingot refers to a plane extending in a direction of a main surface of substrate 1 in forming substrate 1 from the ingot, and to a plane extending in such a direction that, for example, an angle with respect to the C plane (the (0001) plane) of the hexagonal crystal exhibiting the crystal structure of silicon carbide is not smaller than 50° and not greater than 65°. Thereafter, treatment of the main surface of the ingot so as to have a desired diameter of substrate 1 is performed by grinding away an outer circumferential portion of the main surface of the ingot.

In addition, taking into account high yield of semiconductor devices formed on substrate 1, substrate 1 composed of silicon carbide to be used preferably has micropipe density not greater than 1 $cm^{-2}$, dislocation (screw dislocation, edge dislocation, basal plane dislocation) density not greater than $10^3$ $cm^-$, and stacking fault density not greater than 0.1 $cm^{-1}$. Therefore, an ingot satisfying the conditions above is preferably fabricated.

Moreover, an orientation-flat for representing a direction of a crystallographic axis is formed. As described above, for example, if a main surface of an ingot is a plane having a certain angle (off angle) with respect to the C plane, preferably, one orientation-flat (a first orientation-flat) of two orientation-flats intersecting with each other extends in a direction substantially parallel to an off direction (a direction of the off angle) and the other orientation-flat (a second orientation-flat) extends in a direction substantially perpendicular to the off direction.

In succession, a shape of substrate 1 is formed, for example, by using a wire-saw to slice the ingot in a certain thickness in a direction along the main surface. By performing such treatment, the main surface of the ingot can substantially match with the direction of the main surface of substrate 1. Since substrate 1 is a substrate for fabricating a semiconductor device, the thickness above is preferably not smaller than 300 µm and not greater than 500 µm. It is noted that bending of substrate 1 can be lessened by applying a wire for slicing in a direction along the second orientation-flat above. Namely, a value for bow, warp or the like of substrate 1 to finally be formed can be set to a value within the range described above. By beveling the outer edge portion of substrate 1 formed in the procedure above, a corner of the outer edge portion is removed.

Then, main surface 1a, 1b of substrate 1 is subjected to a polishing step. This polishing step is constituted of both-side grinding, both-side lapping, both-side mechanical polishing, and CMP polishing. It is noted that the polishing step above may partially be omitted if a value for surface roughness Ra of main surface 1a, 1b or a value for bow, warp or the like satisfies a desired value.

Initially, in both-side grinding, treatment for shaping substrate 1 and adjusting a value for bow, warp or the like is performed. Both-side grinding is performed by using a both-side working apparatus 90 shown in FIG. 9. Both-side working apparatus 90 includes a lower surface plate 97 arranged in a lower portion, on which substrate 1 to be worked is to be set, and a wafer carrier 99 placed on lower surface plate 97. An upper surface plate 96 is provided above lower surface plate 97 and wafer carrier 99. Upper surface plate 96 is fixed to a surface plate base 95.

Figure 9:
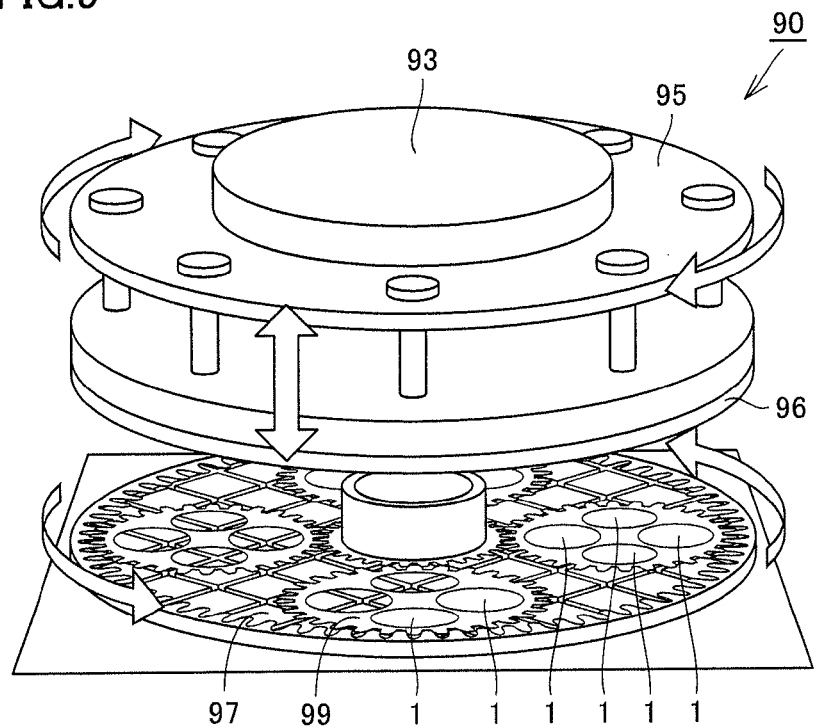
FIG. 9 is a schematic diagram of a both-side working apparatus.

As shown with a vertical arrow in FIG. 9, surface plate base 95 and upper surface plate 96 are movable in the vertical direction. As surface plate base 95 and upper surface plate 96 lower to be in contact with wafer carrier 99 and apply load thereto, rotation around a rotation shaft 93 as shown with an arrow indicating rotation in FIG. 9 is carried out while load from above to below is applied to substrate 1. Namely, upper surface plate 96 and wafer carrier 99 rotate in directions reverse to each other. By doing so, both main surfaces 1a and 1b of substrate 1 set on wafer carrier 99 are polished. Therefore, a main surface of upper surface plate 96 opposed to substrate 1 (main surface 1a) and a main surface of lower surface plate 97 opposed to substrate 1 (main surface 1b) preferably contain an abrasive for polishing main surface 1a, 1b.

For example, upper surface plate 96 and lower surface plate 97 are preferably formed of a metal material such as iron or copper, a grinding stone, or a ceramic material embedded with abrasive grains. In an example where upper surface plate 96 is formed of a metal material such as iron or copper, an abrasive-containing polishing liquid is preferably applied onto the main surface of upper surface plate 96 opposed to substrate 1 (main surface 1a). By doing so, main surfaces 1a and 1b of substrate 1 mounted on wafer carrier 99 can be polished through rotation while upper surface plate 96 is lowered.

In an example where upper surface plate 96 and lower surface plate 97 are formed of a ceramic material embedded with abrasive grains, an appropriate abrasive is embedded in the ceramic material. Therefore, as rotation while upper surface plate 96 is lowered is carried out, the abrasive embedded in upper surface plate 96 and lower surface plate 97 can polish (achieves both-side grinding of) main surface 1a (1b) of substrate 1 mounted on wafer carrier 99. It is noted that a grain size of the abrasive above is preferably not smaller than 30 μm and not greater than 200 μm in both-side grinding.

Both-side lapping will now be described. Both-side grinding described above mainly aims at treatment for adjusting a shape, such as bending of main surface 1a, 1b of substrate 1, whereas both-side lapping mainly aims at polishing treatment for lowering surface roughness of main surface 1a, 1b of substrate 1 as compared with both-side grinding above. Both-side lapping refers to rough polishing treatment among polishing treatments for lowering surface roughness of main surface 1a, 1b.

In both-side lapping, an abrasive smaller in grain size than in both-side grinding is preferably employed. Therefore, using upper surface plate 96 and lower surface plate 97 made of a metal material (in particular, copper, iron or tin), an abrasive is preferably applied onto the surface of upper surface plate 96 opposed to substrate 1. Here, an abrasive having a grain size not smaller than 3 μm and not greater than 10 μm is preferably employed as an abrasive to be applied. It is noted that both-side working apparatus 90 described above can be used for treatment also in both-side lapping and a treatment method is the same as in both-side grinding except for difference in an abrasive or upper surface plate 96 (lower surface plate 97).

Both-side mechanical polishing will now be described. Both-side mechanical polishing refers to polishing before finishing, in order to further lower surface roughness Ra as compared with both-side lapping. Upper surface plate 96 (lower surface plate 97) in performing both-side mechanical polishing is preferably formed of a metal material (in particular, copper or tin), a polishing pad made of unwoven fabric, or a resin material. An abrasive is preferably applied onto the surface of upper surface plate 96 (lower surface plate 97) formed of such a material, that is opposed to substrate 1. Here, an abrasive having a grain size not smaller than 0.5 μm and not greater than 3 μm is preferably employed as an abrasive to be applied. It is noted that both-side working apparatus 90 described above can be used for treatment also in both-side mechanical polishing and a treatment method is the same as in both-side grinding or both-side lapping except for difference in an abrasive or upper surface plate 96 (lower surface plate 97).

Figure 10:
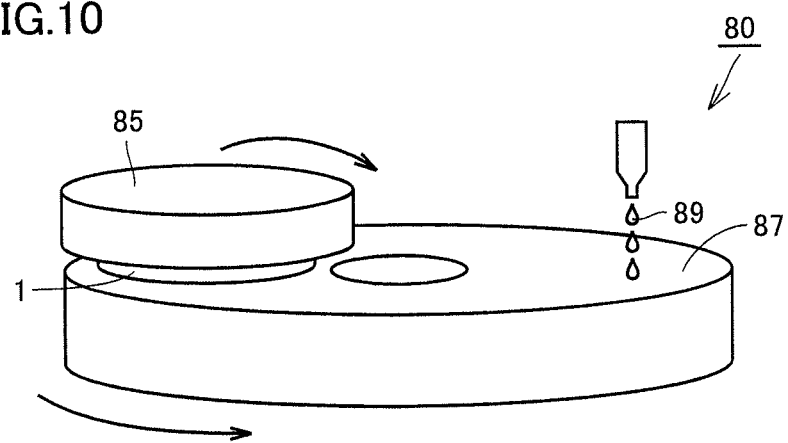
FIG. 10 is a schematic diagram of a CMP working apparatus.

Then, in order to subject only one main surface 1a of substrate 1 to finishing polishing for forming a semiconductor device, CMP polishing is performed. CMP polishing treatment is performed by using a CMP working apparatus 80 shown in FIG. 10. As shown in FIG. 10, a polishing liquid 89 is applied (dropped) onto one main surface of a base for polishing 87 formed, for example, of a polishing pad made of unwoven fabric or a resin material. A polishing liquid mainly composed, for example, of colloidal silica is preferably employed as polishing liquid 89. Then, substrate 1 is bonded to a workpiece 85 such that main surface 1a is opposed to base for polishing 87. Then, workpiece 85 to which substrate 1 is bonded is placed on base for polishing 87.

In this state, workpiece 85 and base for polishing 87 are turned as shown with an arrow indicating rotation in FIG. 10. Thus, main surface 1a (1b) of substrate 1 opposed to base for polishing 87 is polished. Through each treatment above, working such that a value for surface roughness Ra of one main surface of the main surfaces of substrate 1 is not greater than 1 nm and a value for surface roughness Ra of the other main surface opposed to one main surface is not greater than 100 nm is preferably performed. It is noted that, further preferably, a value for surface roughness Ra of main surface 1a of substrate 1 on which a thin film is to be formed is not greater than 1 nm and a value for surface roughness Ra of main surface 1b on which a thin film is not to be formed is not greater than 100 nm. Then, substrate 1 is subjected to organic washing and RCA washing. Through the procedure above, substrate 1 having a desired degree of bending or surface roughness can be formed.

Figure 8:
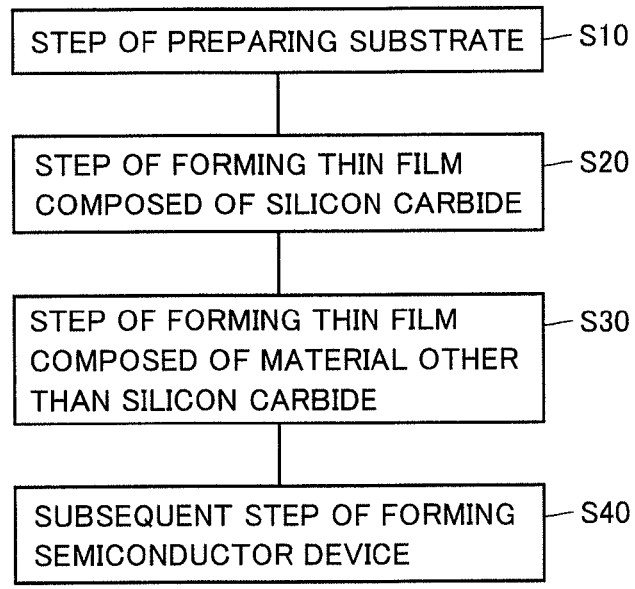
FIG. 8 is a flowchart showing a method of manufacturing a semiconductor device including the substrate according to the embodiment of the present invention.

Then, in the step of forming a thin film composed of silicon carbide (S20) shown in FIG. 8, a thin film composed of silicon carbide (an epitaxial layer) is formed on main surface 1a of substrate 1 composed of silicon carbide, for example, with a CVD epitaxial growth method. Thus, as shown in FIG. 2, substrate with a thin film 2 in which silicon-carbide thin film 4 is formed on main surface 1a of substrate 1 is formed. Here, a hydrogen gas is employed as a carrier gas for forming a thin film of silicon carbide and a silane ($SiH_4$) gas or a propane ($C_3H_8$) gas is employed as a source gas. It is noted that, preferably, for example, a nitrogen ($N_2$) gas is simultaneously introduced if an n-type dopant is to be contained as an impurity in silicon-carbide thin film 4, and for example, trimethylaluminum (TMA) is introduced if a p-type dopant is to be contained as an impurity in silicon-carbide thin film 4. In addition, in an example where a value for bow, warp or the like of substrate 1 for substrate with a thin film 2 is controlled to be within the range above in using the gas above, such conditions as a temperature of a growth furnace not lower than 1400° C. and not higher than 1800° C. and heating for a time period not shorter than 30 minutes and not longer than 300 minutes in epitaxial growth are preferably employed.

In the step of forming a thin film composed of silicon carbide (S20), a member formed with a member mainly composed of carbon is preferably employed as a member for carrying substrate 1. A region of a surface of the member for carrying substrate 1, that is, a region with which main surface 1b of substrate 1 comes in contact, however, is preferably coated with a thin film made of a material other than silicon carbide, such as tantalum carbide (TaC). Thus, adhesion of silicon carbide onto main surface 1b of substrate 1 (a main surface where silicon-carbide thin film 4 is not formed) can be suppressed. In addition, occurrence of deformation of substrate 1 such as bending due to thermal stress at the time of sublimation of silicon carbide adhered onto the surface of main surface 1b as a result of heating can be suppressed.

The step of forming a thin film composed of a material other than silicon carbide (S30) to be performed next refers to the step of forming a thin film of a metal, an insulating film or the like for forming an electrode, an insulator or the like forming a semiconductor device, as non-silicon-carbide thin film 5 on substrate with a thin film 3 shown in FIG. 3. An example of non-silicon-carbide thin film 5 includes an ion implantation prevention film formed for a region in which ion implantation performed in forming an impurity layer or region forming a semiconductor device is desirably prevented. For example, preferably, a thin film of tungsten or aluminum is formed as a metal film and a silicon oxide film ($SiO_2$) is formed as an insulating film. In addition, a thin film of aluminum, aluminum to which silicon has been added, copper, polycrystalline silicon, nickel, or titanium may be formed as an interconnection material for a semiconductor device to be formed. Such a thin film is preferably formed, for example, with a vapor deposition method or a sputtering method.

A silicon oxide film ($SiO_2$), a silicon nitride film ($Si_3N_4$), a silicon oxynitride film (SiON), or the like can be formed as a gate insulating film or an interlayer insulating film of a semiconductor device or as a passivation film for protecting a surface of a semiconductor device. Such an insulating film is preferably formed, for example, with a thermal oxidation method or a CVD method.

Various thin films serving as non-silicon-carbide thin film 5 described above are preferably formed while controlling a heating temperature, a heating time period or the like such that a value for bow, warp or the like of substrate 1 at the main surface of the substrate with a thin film after formation of the various thin films is within the range described above, that is, not smaller than 0 μm and not greater than 150 μm.

The subsequent step of forming a semiconductor device (S40) shown in FIG. 8 refers to the step of forming a semiconductor device having a desired pattern by subjecting non-silicon-carbide thin film 5 formed as above to the photolithography process. In the photolithography process, a desired pattern is preferably formed by using a resist and an exposure apparatus such that a defect like exposure variation is not caused in an outer edge portion thereof.

With the use of substrate 1 or substrate with a thin film 2, 3 described above, by performing processing based on the method of manufacturing a semiconductor device above, a semiconductor device including a high-quality pattern free from such a defect as exposure variation can be formed.

Therefore, electrical characteristics such as a current-voltage characteristic in the semiconductor device can be stable.

Example 1

Various semiconductor devices formed with the substrate (substrate with a thin film) and the method of manufacturing a semiconductor device according to the embodiment of the present invention will be described hereinafter as Examples.

Figure 11:
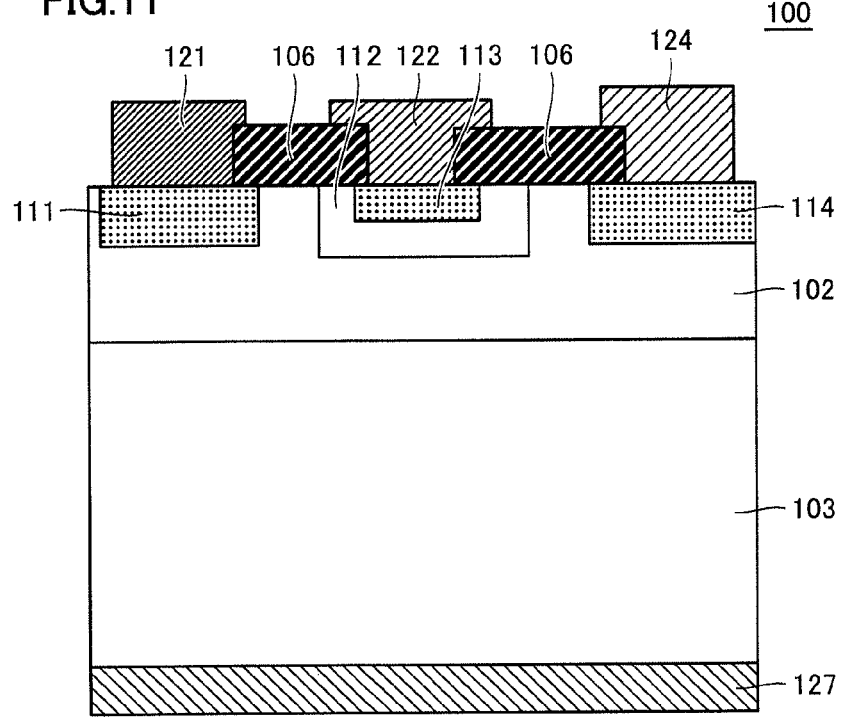
FIG. 11 is a schematic cross-sectional view showing a structure of a lateral JFET formed with the substrate according to the embodiment of the present invention.

A lateral JFET 100 shown in FIG. 11 includes a p⁻ type SiC substrate 103 and an n⁻ type SiC epi layer 102. An n⁺ type source impurity region 111, a p⁺ type gate impurity region 113, and an n⁺ type drain impurity region 114 are included in a region at a certain depth from a main surface of n⁻ type SiC epi layer 102 on the side not opposed to p⁻ type SiC substrate 103 (upper side in FIG. 11). There is a p-type gate impurity region 112 around p⁺ type gate impurity region 113. A source electrode 121, a gate electrode 122, and a drain electrode 124 are formed on upper main surfaces of n⁺ type source impurity region 111, p⁺ type gate impurity region 113, and n⁺ type drain impurity region 114, respectively. An interlayer insulating film 106 is arranged between source electrode 121 and gate electrode 122 and between gate electrode 122 and drain electrode 124. The interlayer insulating film is formed in order to protect a device surface. A substrate back electrode 127 is arranged on a main surface of p⁻ type SiC substrate 103 on a side not opposed to n⁻ type SiC epi layer 102 (lower side in FIG. 11). It is noted that the p-type and the n-type of each component described above may all be reversed.

For example, p⁻ type SiC substrate 103 is formed of p-type silicon carbide. The p⁻ type means low concentration of a p-type impurity, high resistance, and semi-insulating property. Specifically, p⁻ type SiC substrate 103 is made of a silicon carbide substrate having a thickness not smaller than 300 μm and not greater than 400 μm and an impurity concentration of boron atoms of $1\times10^{15}$ cm⁻³. In addition, n⁻ type SiC epi layer 102 is formed of an epitaxial layer low in an n-type impurity concentration. Specifically, n⁻ type SiC epi layer 102 is formed of a silicon carbide epitaxial layer having a thickness of approximately 1 μm and an impurity concentration of nitrogen atoms of $1\times10^{16}$ cm⁻³. Moreover, n⁺ type source impurity region 111 and n⁺ type drain impurity region 114 are each formed of an n-type ion implantation layer, and p⁺ type gate impurity region 113 and p-type gate impurity region 112 are each formed of a p-type ion implantation layer. The n⁺ type means high concentration of an n-type impurity, and the p⁺ type means high concentration of a p-type impurity. Specifically, n⁺ type source impurity region 111 is an n-type layer containing nitrogen atoms by approximately $1\times10^{19}$ cm⁻³ and having a thickness of approximately 0.4 μm. P⁺ type gate impurity region 113 is a p-type layer containing aluminum atoms by approximately $1\times10^{19}$ cm⁻³ and having a thickness of approximately 0.4 μm. Further, p-type gate impurity region 112 around p⁺ type gate impurity region 113 is lower in impurity concentration than p⁺ type gate impurity region 113 and higher in impurity concentration than n⁻ type SiC epi layer 102 or p⁻ type SiC substrate 103. For example, it is a p-type layer containing aluminum atoms or boron atoms at an impurity concentration of approximately $1\times10^{18}$ cm⁻³ and having a thickness of approximately 0.5 μm.

The impurity concentration is differed for each region as above, in order to adapt to characteristics required in lateral JFET 100. For example, n⁺ type source impurity region 111 or the like connected to an electrode such as source electrode 121 is high in impurity concentration, in order to form ohmic contact by lowering electrical resistance at a portion of contact between the electrode and the impurity region. Meanwhile, p-type gate impurity region 112 around p⁺ type gate impurity region 113, p⁻ type SiC substrate 103 or the like is low in impurity concentration, in order to control a thickness of a depletion layer formed based on a voltage across gate electrode 122 and substrate back electrode 127 to a desired thickness.

Here, an operation of lateral JFET 100 will be described. Lateral JFET 100 is a semiconductor device controlling magnitude of a current that flows from source electrode 121 to drain electrode 124 by adjusting a thickness of a depletion layer at a pn junction formed by p-type gate impurity region 112 (p⁺ type gate impurity region 113) and n⁻ type SiC epi layer 102 by applying a voltage to gate electrode 122.

For example, a positive voltage is applied to gate electrode 122. In this case, no depletion layer is produced at a pn junction formed by the p-type region of p-type gate impurity region 112 and the n-type region in n⁻ type SiC epi layer 102 present under p-type gate impurity region 112 shown in FIG. 11. Therefore, as shown in FIG. 11, a region of n⁻ type SiC epi layer 102 through which electrons can pass is present under p-type gate impurity region 112.

In contrast, for example, a negative voltage is applied to gate electrode 122. In this case, a depletion layer is produced at the pn junction formed by the p-type region in p-type gate impurity region 112 and the n-type region in n⁻ type SiC epi layer 102 present under p-type gate impurity region 112 shown in FIG. 11. When this depletion layer reaches a boundary surface with p⁻ type SiC substrate 103 in n⁻ type SiC epi layer 102 under p-type gate impurity region 112, flow of electrons from source electrode 121 to drain electrode 124 is blocked in that region. Therefore, electrons that flow from source electrode 121 to drain electrode 124 cannot be output as a drain current.

Thus, lateral JFET 100 can control a current that flows from source electrode 121 to drain electrode 124 in particular by controlling a thickness of the depletion layer in n⁻ type SiC epi layer 102 under p-type gate impurity region 112 by changing application of a voltage to gate electrode 122.

A method of manufacturing lateral JFET 100 will now be described. In forming lateral JFET 100, it is preferred to follow the manufacturing method shown in the flowchart in FIG. 8 described above.

Initially, in the step of preparing a substrate (S10) shown in FIG. 8, p⁻ type SiC substrate 103 is prepared. Specifically, p⁻ type SiC substrate 103 composed of silicon carbide, containing an impurity of boron, for example, by approximately $1 \times 10^{15}$ cm$^{-3}$, and having a main surface in such a direction that an angle with respect to the C plane ((0001) plane) is not smaller than 50° and not greater than 65°, similarly to substrate 1 shown in FIG. 1 or substrate 1 for substrate with a thin film 2 shown in FIG. 2 described above for example, is prepared. Working for slicing the p⁻ type SiC substrate in a thickness not smaller than 300 μm and not greater than 400 μm is performed. For example, a wire-saw is employed for working for slicing. It is noted that an orientation-flat is preferably formed in p⁻ type SiC substrate 103 prior to working for slicing. In addition, the outer edge portion of sliced p⁻ type SiC substrate 103 is preferably removed.

In succession, one main surface of p⁻ type SiC substrate 103 and the other main surface opposed to one main surface are subjected to the polishing step. Specifically, as described above, both-side grinding, both-side lapping, both-side mechanical polishing, and CMP polishing are performed as the polishing step. Consequently, p⁻ type SiC substrate 103 in which a value for bow at one main surface and the other main surface opposed to one main surface is not smaller than −40 μm and not greater than −5 μm and a value for warp at both main surfaces is not smaller than 5 μm and not greater than 40 μm is prepared. In addition, a value for surface roughness Ra of one main surface of p⁻ type SiC substrate 103 is set to 1 nm or lower and a value for surface roughness Ra of the other main surface is set to 100 nm or lower.

In succession, in the step of forming a thin film composed of silicon carbide (S20) shown in FIG. 8, n⁻ type SiC epi layer 102 which is an epitaxial layer composed of silicon carbide is formed with the CVD epitaxial growth method, on one main surface (upper main surface in FIG. 11) of p⁻ type SiC substrate 103. Here, in order to form n⁻ type SiC epi layer 102, for example, a silane ($SiH_4$) gas and a propane ($C_3H_8$) gas are employed as a source gas. Alternatively, in a case where n⁻ type SiC epi layer 102 is composed of n-type silicon carbide, a nitrogen gas is employed as a source of an n-type impurity. In a case where n⁻ type SiC epi layer 102 is composed of p-type silicon carbide instead of the n-type, for example, trimethylaluminum (TMA) is introduced as a source of a p-type impurity. Here, the gas above is preferably introduced such that concentration of an impurity in n⁻ type SiC epi layer 102 is approximately $1 \times 10^{16}$ cm$^{-3}$.

Here, a temperature in a growth furnace is set to 1400° C. or higher and 1800° C. or lower and heating for a time period not shorter than 30 minutes and not longer than 300 minutes is performed in epitaxial growth. Treatment is thus performed so that a value for bow at one main surface of p⁻ type SiC substrate 103 having n⁻ type SiC epi layer 102 formed thereon and at the other main surface opposed to one main surface is not smaller than −40 μm and not greater than 0 μm and a value for warp at both main surfaces is not smaller than 0 μm and not greater than 40 μm.

Hereinafter, in order to form lateral JFET 100, a thin film or the like of a metal is formed in the step of forming a thin film composed of a material other than silicon carbide (S30). Specifically, initially, n⁺ type source impurity region 111 and n⁺ type drain impurity region 114 that are n-type layers are formed with the ion implantation method, in the main surface of n⁻ type SiC epi layer 102, on the side opposite to the main surface facing p⁻ type SiC substrate 103. More specifically, an implantation protection film is formed, for example, with the CVD method, to a thickness of approximately 0.5 μm, on the main surface of n⁻ type SiC epi layer 102, on the side opposite to the main surface facing p⁻ type SiC substrate 103. Preferably, the implantation protection film formed here is, for example, a silicon oxide film or a silicon nitride film. Then, a resist having a certain thickness is further applied onto a main surface of the implantation protection film. Here, the photolithography technique is used to remove the resist from the region where ions are to be implanted. Then, for example with a reactive ion etching method (RIE method), the implantation protection film in the region from which the resist was removed is removed. After the resist is completely removed, ions are implanted into n⁻ type SiC epi layer 102, in the region from which the implantation protection film was removed, to thereby form n⁺ type source impurity region 111 and n⁺ type drain impurity region 114. Since these are n-type layers, ions of an n-type impurity such as nitrogen (N) or phosphorus (P) are preferably implanted. Here, ions of the n-type impurity are accelerated by a voltage of several hundred kV and implanted into n⁻ type SiC epi layer 102. Here, in order to suppress damages of n⁻ type SiC epi layer 102 or p⁻ type SiC substrate 103 by the implanted ions, ions are preferably implanted after n⁻ type SiC epi layer 102 or p⁻ type SiC substrate 103 is heated to approximately 300° C.

Alternatively, n⁺ type source impurity region 111 and n⁺ type drain impurity region 114 may be formed by embedding and growing an n-type epitaxial layer instead of ion implantation. By implanting ions as above, p-type gate impurity region 112 and p+ type gate impurity region 113 that are p-type layers can be formed. Here, ions, for example, of aluminum (Al), boron (B) or the like are preferably implanted. It is noted that, preferably, concentration of an impurity in n+ type source impurity region 111, p+ type gate impurity region 113 or n+ type drain impurity region 114 is set to approximately $1\times10^{19}$ cm$^{-3}$ and concentration of an impurity in p-type gate impurity region 112 is set to approximately $1\times10^{18}$ cm$^{-3}$.

In order to activate impurities in n+ type source impurity region 111, p-type gate impurity region 112, p+ type gate impurity region 113, and n+ type drain impurity region 114 formed as described above, annealing treatment is preferably performed. A system including p− type SiC substrate 103 and n− type SiC epi layer 102 having each impurity region above formed therein is preferably subjected to heat treatment, for example, in an argon (Ar) atmosphere or a neon (Ne) atmosphere. Alternatively, heat treatment may be performed in vacuum.

Then, interlayer insulating film 106 is formed to a thickness of approximately 0.5 μm with the CVD method or the thermal oxidation method, on the main surface of n− type SiC epi layer 102 on the side opposite to the main surface facing p− type SiC substrate 103. Here, preferably, interlayer insulating film 106 to be formed is, for example, a silicon oxide film or a silicon nitride film. Then, a resist having a certain thickness is further applied onto the main surface of interlayer insulating film 106. Here, the photolithography technique is used to remove the resist from a region where an ohmic electrode is desirably formed. Then, interlayer insulating film 106 in the region from which the resist was removed is removed, for example, with the RIE method. After the resist is completely removed, a thin film of metal is formed. This thin film of metal is a thin film for forming source electrode 121, gate electrode 122 and drain electrode 124. Therefore, a metal material allowing ohmic contact with n+ type source impurity region 111, p+ type gate impurity region 113 and n+ type drain impurity region 114 is preferably used. For example, a thin film of nickel silicon (NiSi) may be formed. Here, the thin film of metal is preferably formed, for example, with the vapor deposition method or the sputtering method. Here, treatment is preferably performed such that a value for bow at one main surface of p− type SiC substrate 103 and at the other main surface opposed to one main surface is not smaller than 0 μm and not greater than 150 μm and a value for warp at both main surfaces is not smaller than 0 μm and not greater than 150 μm. In addition, substrate back electrode 127 is formed, for example, of a thin film of nickel silicon, on the main surface of p− type SiC substrate 103 on the side opposite to the main surface where n− type SiC epi layer 102 is formed (lower side in FIG. 11).

After the step of forming a thin film composed of a material other than silicon carbide (S30) is completed in the above, the subsequent step of forming a semiconductor device (S40) is performed. Here, specifically, the thin film of metal formed in the previous step (S30) is subjected to the photolithography technique, to thereby form source electrode 121, gate electrode 122 and drain electrode 124 shown in FIG. 11. Here, if a value for bow at one main surface of p− type SiC substrate 103 and at the other main surface opposed to one main surface is not smaller than 0 μm and not greater than 150 μm and a value for warp at both main surfaces is not smaller than 0 μm and not greater than 150 μm as described above, occurrence of exposure variation or the like in a pattern of source electrode 121 or the like to be formed can be suppressed. Therefore, such a defect as overlapping between adjacent patterns (source electrode 121 and gate electrode 122, and the like) can be suppressed, and lateral JFET 100 having a dimension in accordance with a design value can be formed. Therefore, electrical characteristics (current-voltage characteristic) such as a current-voltage characteristic in lateral JFET 100 can be stable.

Example 2

Figure 12:
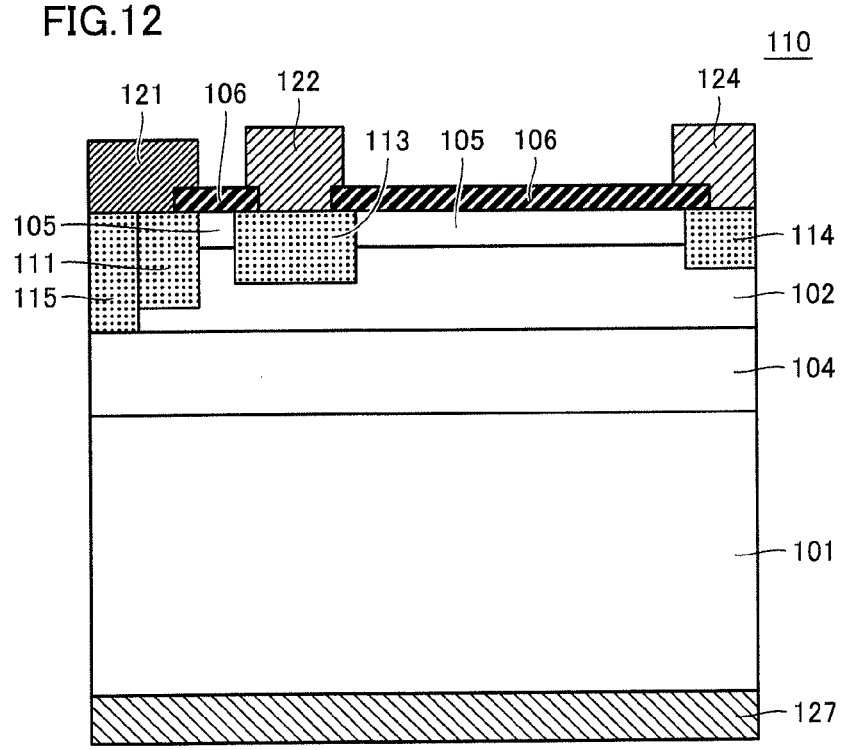
FIG. 12 is a schematic cross-sectional view showing a structure of a RESURF lateral JFET formed with the substrate according to the embodiment of the present invention.

A RESURF lateral JFET 110 shown in FIG. 12 includes a stack structure of an n+ type SiC substrate 101, a p− type SiC epi layer 104, n− type SiC epi layer 102, and a surface p-type epi layer 105. N+ type source impurity region 111, p+ type gate impurity region 113, n+ type drain impurity region 114, and a p+ type embedded-connection impurity region 115 are included in a region at a certain depth from main surfaces of surface p-type epi layer 105 and n− type SiC epi layer 102 on the side not opposed to p− type SiC epi layer 104 (upper side in FIG. 12). Source electrode 121, gate electrode 122, and drain electrode 124 are formed on upper main surfaces of n+ type source impurity region 111 and p+ type embedded-connection impurity region 115, p+ type gate impurity region 113, and n+ type drain impurity region 114, respectively. Interlayer insulating film 106 is arranged between source electrode 121 and gate electrode 122 and between gate electrode 122 and drain electrode 124. Substrate back electrode 127 is arranged on a main surface of n+ type SiC substrate 101 on a side not opposed to p− type SiC epi layer 104 (lower side in FIG. 12). It is noted that the p-type and the n-type of each component described above may all be reversed.

N+ type SiC substrate 101 is formed of a silicon carbide substrate of low resistance, having a thickness not smaller than 300 μm and not greater than 400 μm and concentration of an impurity of nitrogen atoms of $1\times10^{19}$ cm$^{-3}$. In addition, p− type SiC epi layer 104 is a layer having a thickness of approximately 5 μm, to which aluminum or boron atoms were added as an impurity by approximately $1\times10^{17}$ cm$^{-3}$. N− type SiC epi layer 102 is a layer containing an impurity of nitrogen atoms by approximately $1\times10^{17}$ cm$^{-3}$ and having a thickness of approximately 1 μm. Surface p-type epi layer 105 is a layer having a thickness of approximately 0.2 μm, to which aluminum or boron atoms were added as an impurity by approximately $1\times10^{17}$ cm$^{-3}$. In addition, n+ type source impurity region 111 or n+ type drain impurity region 114 is an n-type layer containing nitrogen atoms by approximately $1\times10^{19}$ cm$^{-3}$ and having a thickness of approximately 0.4 μm. P+ type gate impurity region 113 is a p-type layer containing aluminum atoms by approximately $1\times10^{19}$ cm$^{-3}$ and having a thickness of approximately 0.4 μm. Since p+ type embedded-connection impurity region 115 is formed in a region extending from the main surface (uppermost surface) of surface p-type epi layer 105 to a lowermost surface of n− type SiC epi layer 102, it is a p-type layer having a thickness of approximately 1.2 μm and containing aluminum atoms by approximately $1\times10^{19}$ cm$^{3}$ as in p+ type gate impurity region 113. This p+ type embedded-connection impurity region 115 allows control of a potential at p− type SiC epi layer 104 by using source electrode 121, by electrically connecting source electrode 121 and p− type SiC epi layer 104 to each other.

An operation of RESURF lateral JFET 110 will now be described. In RESURF lateral JFET 110 as well, as in lateral JFET 100, electrons are supplied from source electrode 121 to n+ type source impurity region 111 and electrons flow from n+ type drain impurity region 114 to drain electrode 124 through n− type SiC epi layer 102 under p+ type gate impurity region 113. Thus, electrons that flow from source electrode 121 to drain electrode 124 can be output as a drain current.

In RESURF lateral JFET 110, a thickness of a depletion layer at a pn junction between p+ type gate impurity region 113 and n− type SiC epi layer 102 thereunder is adjusted by changing voltage application across gate electrode 122 and source electrode 121. For example, a negative voltage is applied to gate electrode 122 and a positive voltage is applied to source electrode 121. In this case, a depletion layer is produced between surface p-type layer 105 and n− type SiC epi layer 102. Therefore, even if a voltage is applied across source electrode 121 and drain electrode 124 so that electrons flow from source electrode 121 to drain electrode 124, a current that flows between source electrode 121 and drain electrode 124 cannot be output due to the presence of the depletion layer. Thus, magnitude of a current between source electrode 121 and drain electrode 124 is controlled.

In RESURF lateral JFET 110, electric field between gate electrode 122 and drain electrode 124 is substantially constant and a withstand voltage is dependent on a distance between gate electrode 122 (source electrode 121) and drain electrode 124. In contrast, in lateral JFET 100, electric field is weaker in a region closer to drain electrode 124. Therefore, when RESURF lateral JFET 110 is compared with lateral JFET 100 based on a distance between the same gate electrode 122 (source electrode 121) and drain electrode 124, RESURF lateral JFET 110 is higher in withstand voltage than lateral JFET 100.

A method of manufacturing RESURF lateral JFET 110 will now be described. In forming RESURF lateral JFET 110, it is preferred to follow the manufacturing method shown in the flowchart in FIG. 8 described above.

In the step of preparing a substrate (S10) shown in FIG. 8, n+ type SiC substrate 101 is prepared. Specifically, n+ type SiC substrate 101 composed of silicon carbide, containing an impurity of nitrogen, for example, by approximately $1 \times 10^{19}$ cm$^{-3}$ and having a main surface in such a direction that an angle with respect to the C plane ((0001) plane) is not smaller than 50° and not greater than 65°, for example, similarly to substrate 1 shown in FIG. 1 or substrate 1 for substrate with a thin film 2 shown in FIG. 2 described above, is prepared. By subjecting this n+ type SiC substrate 101 to slicing and the polishing step as in the case of p− type SiC substrate 103 of lateral JFET 100 described above, n+ type SiC substrate 101 is prepared. Here, a value for bow at one main surface and at the other main surface opposed to one main surface, a value for warp at both main surfaces, and further a value for surface roughness Ra of one main surface are preferably set similarly to those of lateral JFET 100.

In succession, in the step of forming a thin film composed of silicon carbide (S20) shown in FIG. 8, p− type SiC epi layer 104, n− type SiC epi layer 102 and surface p-type epi layer 105 are successively formed with the CVD method on one main surface (upper main surface in FIG. 12) of n+ type SiC substrate 101. Since these are layers composed of SiC, for example, a silane (SiH$_4$) gas and a propane (C$_3$H$_8$) gas are employed as a source gas. Here, in forming a p-type layer, for example, trimethylaluminum (TMA) or a boron gas is preferably employed as a source of a p-type impurity. In addition, in forming an n-type layer, a nitrogen gas is preferably employed as a source of an n-type impurity.

Hereinafter, in order to form RESURF lateral JFET 110, a thin film or the like of metal is formed in the step of forming a thin film composed of a material other than silicon carbide (S30). An implantation protection film is formed in the procedure similar to that for each impurity region in lateral JFET 100, and then n+ type source impurity region 111 and n+ type drain impurity region 114 that are n-type implantation layers are formed with the ion implantation method. In addition, p+ type gate impurity region 113 and p+ type embedded-connection impurity region 115 are formed, and then source electrode 121, gate electrode 122, drain electrode 124, and substrate back electrode 127 as thin films of metal are formed. Moreover, in the step of forming a semiconductor device (S40), the photolithography technique or the like is employed in the procedure similar to that for lateral JFET 100. Thus, RESURF lateral JFET 110 shown in FIG. 12 can be formed.

RESURF lateral JFET 110 formed in the procedure above includes n+ type SiC substrate 101, in which bending at the time of formation of n− type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and RESURF lateral JFET 110 having a dimension in accordance with a design value can be formed. Therefore, electrical characteristics such as a current-voltage characteristic in RESURF lateral JFET 110 can be stable.

Present Example 2 is different from present Example 1 only in each point described above. Namely, present Example 2 fully conforms to present Example 1 in a configuration or a condition, a procedure, an effect, or the like that was not described above.

Example 3

Figure 13:
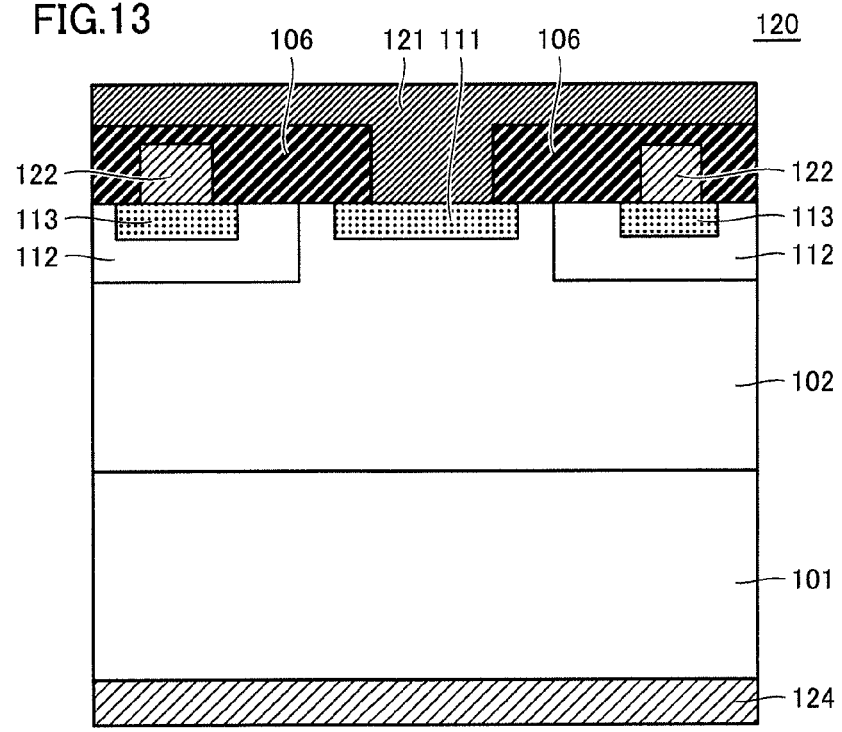
FIG. 13 is a schematic cross-sectional view showing a structure of a vertical JFET formed with the substrate according to the embodiment of the present invention.

A vertical JFET 120 shown in FIG. 13 includes n+ type SiC substrate 101 and n− type SiC epi layer 102. A partial region of n− type SiC epi layer 102 includes a pair of p-type gate impurity regions 112. In p-type gate impurity regions 112, a pair of p+ type gate impurity regions 113 is provided respectively, and on p+ type gate impurity regions 113, a pair of gate electrodes 122 is provided respectively. In a region lying between the pair of p-type gate impurity regions 112, n+ type source impurity region 111 is arranged. Source electrode 121 is arranged on n+ type source impurity region 111. Drain electrode 124 is provided on a main surface of n+ type SiC substrate 101 on the side opposite to the main surface opposed to n− type SiC epi layer 102 (lower side in FIG. 13). It is noted that the p-type and the n-type of each component described above may all be reversed.

N+ type SiC substrate 101 is formed of a silicon carbide substrate of low resistance, having a thickness not smaller than 300 μm and not greater than 400 μm and concentration of an impurity of nitrogen atoms of $1 \times 10^{19}$ cm$^{-3}$. N− type SiC epi layer 102 is a layer containing an impurity of nitrogen atoms by approximately $5 \times 10^{15}$ cm$^{-3}$ and having a thickness of approximately 10 μm. P+ type gate impurity region 113 is a p-type layer containing aluminum atoms by approximately $1 \times 10^{19}$ cm$^{-3}$ and having a thickness of approximately 0.4 μm. Further, p-type gate impurity region 112 is a p-type layer containing, for example, aluminum atoms or boron atoms as an impurity at concentration of approximately $1 \times 10^{18}$ cm$^{-3}$ and having a thickness of approximately 1.5 μm.

An operation of vertical JFET 120 will now be described. Vertical JFET 120 controls a pn junction formed by p-type gate impurity region 112 and n− type SiC epi layer 102 by applying a voltage to gate electrode 122.

A case where a voltage positive with respect to the source is applied to gate electrode 122 will now be considered. As the positive voltage is applied to gate electrode 122, a depletion layer is not formed between p-type gate impurity region 112 electrically connected to gate electrode 122 and n− type SiC epi layer 102. Therefore, if a voltage positive with respect to the source is applied to drain electrode 124 in this state, electrons pass from source electrode 121 through n+ type source impurity region 111, n− type SiC epi layer 102 and n+ type SiC substrate 101 and reach drain electrode 124. Thus, electrons that flow from source electrode 121 to drain electrode 124 can be output as a drain current.

For example, however, if a voltage negative with respect to the source is applied to gate electrode 122, a depletion layer at the pn junction is formed between p-type gate impurity region 112 and n− type SiC epi layer 102. The depletion layer formed between p-type gate impurity region 112 on the left in FIG. 13 and n− type SiC epi layer 102 and the depletion layer formed between p-type gate impurity region 112 on the right and n− type SiC epi layer 102 are coupled and integrated with each other in the region under n+ type source impurity region 111 in FIG. 13. Then, flow of electrons from source electrode 121 to drain electrode 124 is blocked and it becomes difficult to feed a current from source electrode 121 to drain electrode 124. Based on the principles above, in vertical JFET 120, magnitude of a current can be controlled in accordance with polarity of a voltage to be applied to an electrode.

A method of manufacturing vertical JFET 120 basically conforms to the method of manufacturing lateral JFET 100 described above. Formed vertical JFET 120 includes n+ type SiC substrate 101, in which bending at the time of formation of n− type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and vertical JFET 120 having a dimension in accordance with a design value can be formed. In addition, occurrence of a defect due to overlapping of the pair of p-type gate impurity regions 112 can also be suppressed. Therefore, electrical characteristics such as a current-voltage characteristic in vertical JFET 120 can be stable.

Present Example 3 is different from present Example 1 only in each point described above. Namely, present Example 3 fully conforms to present Example 1 in a configuration or a condition, a procedure, an effect, or the like that was not described above.

Example 4

Figure 14:
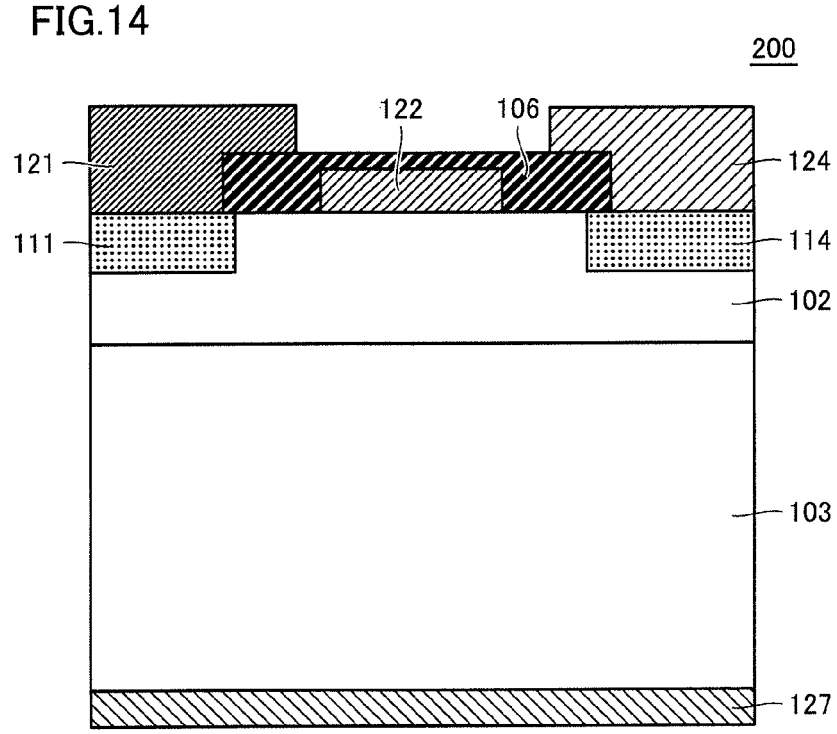
FIG. 14 is a schematic cross-sectional view showing a structure of a lateral MESFET formed with the substrate according to the embodiment of the present invention.

A lateral MESFET 200 shown in FIG. 14 includes a structure basically similar to that of lateral JFET 100 shown in FIG. 11. Lateral MESFET 200, however, does not include p-type gate impurity region 112 and p+ type gate impurity region 113. In addition, n− type SiC epi layer 102 is a layer containing an impurity of nitrogen atoms by approximately $1 \times 10^{17}$ cm$^{-3}$ and having a thickness of approximately 1 μm. Lateral MESFET 200 is different from lateral JFET 100 only in the point above. It is noted that the p-type and the n-type of each component described above may all be reversed.

An operation of lateral MESFET 200 will now be described. Here, for example, it is assumed that gate electrode 122 made of a metal material greater in a work function than n− type SiC epi layer 102 is formed on n− type SiC epi layer 102.

Here, a Schottky barrier is formed at a junction between gate electrode 122 and n− type SiC epi layer 102. The Schottky barrier is a region having a function similar to that of a depletion layer blocking flow of electrons. Therefore, even if a potential difference is applied across source electrode 121 and drain electrode 124 while the Schottky barrier is formed, electrons supplied to n+ type source impurity region 111 are prevented from flowing through a region lying between n+ type source impurity region 111 and n+ type drain impurity region 114. Namely, it is difficult to feed electrons from n+ type source impurity region 111 to n+ type drain impurity region 114.

This situation becomes further noticeable, for example, when a negative voltage is applied to gate electrode 122. Here, the Schottky barrier above becomes high and a depletion layer within n− type SiC epi layer 102 further expands. Therefore, flow of electrons from n+ type source impurity region 111 to n+ type drain impurity region 114 is further blocked.

Meanwhile, for example, when a positive voltage is applied to gate electrode 122, the Schottky barrier is lowered. Consequently, a depletion layer is not formed in the vicinity of a junction surface between n− type SiC epi layer 102 and gate electrode 122. If a potential difference is applied across source electrode 121 and drain electrode 124 in this situation, electrons supplied to n+ type source impurity region 111 reach drain electrode 124 through n+ type drain impurity region 114. Namely, a current can flow between source electrode 121 and drain electrode 124. Based on the principles above, in lateral MESFET 200, a current can be controlled in accordance with a voltage to be applied to gate electrode 122.

For example, in the case of lateral JFET 100 described above, a depletion layer formed by a pn junction is controlled. The depletion layer formed here is formed in both of the p-type region and the n-type region. In contrast, in the case of lateral MESFET 200, a depletion layer is formed only in n− type SiC epi layer 102, and no depletion layer is formed in gate electrode 122 joined to n− type SiC epi layer 102. Therefore, the depletion layer in lateral MESFET 200 is smaller in thickness than the depletion layer in lateral JFET 100. Therefore, in lateral MESFET 200, a response time for forming or eliminating a depletion layer by applying a voltage can be shorter than in lateral JFET 100.

As described above, the Schottky barrier is formed at the junction between gate electrode 122 and n− type SiC epi layer 102. Therefore, unlike lateral JFET 100 and the like described above, in lateral MESFET 200, a metal material capable of establishing Schottky contact with n− type SiC epi layer 102 while a voltage is not applied is preferably employed as a material for forming gate electrode 122. For example, an alloy of Ti (titanium), Ni (nickel) and Au (gold) is preferably employed as a metal material capable of establishing Schottky contact with SiC. For source electrode 121 and drain electrode 124, however, a metal material capable of establishing ohmic contact with an SiC layer to be joined is preferably employed, as in the case of lateral JFET 100 and the like described above.

Lateral MESFET 200 has a structure similar to lateral JFET 100 described above, except for absence of p-type gate impurity region 112 and p+ type gate impurity region 113 or impurity concentration in a partial region. Therefore, a method of manufacturing lateral MESFET 200 basically conforms to the method of manufacturing lateral JFET 100.

Lateral MESFET 200 formed in the procedure above includes p− type SiC substrate 103, in which bending at the time of formation of n− type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and lateral MESFET 200 having a dimension in accordance with a design value can be formed. Therefore, electrical characteristics such as a current-voltage characteristic in lateral MESFET 200 can be stable.

Present Example 4 is different from present Example 1 only in each point described above. Namely, present Example 4 fully conforms to present Example 1 in a configuration or a condition, a procedure, an effect, or the like that was not described above.

Example 5

Figure 15:
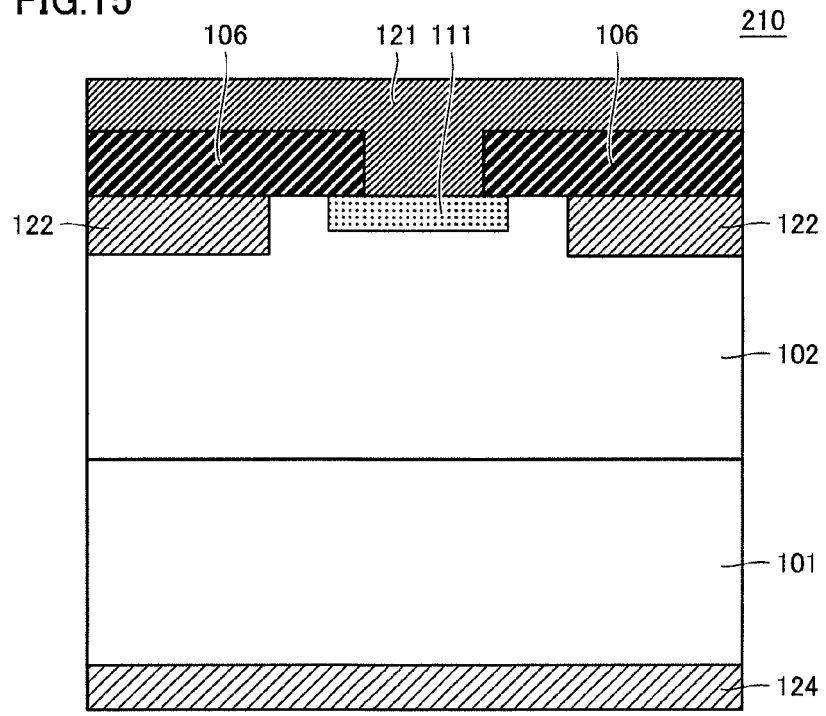
FIG. 15 is a schematic cross-sectional view showing a structure of a vertical MESFET formed with the substrate according to the embodiment of the present invention.

A vertical MESFET 210 shown in FIG. 15 includes a structure basically similar to that of vertical JFET 120 shown in FIG. 13. Vertical MESFET 210, however, does not include p-type gate impurity region 112 and p$^+$ type gate impurity region 113, but it has a structure having gate electrode 122 embedded in a trench. Vertical MESFET 210 is different from vertical JFET 120 only in this regard. It is noted that the p-type and the n-type of each component described above may all be reversed.

An operation of vertical MESFET 210 will now be described. Here, for example, it is assumed that gate electrode 122 made of a metal material greater in a work function than n$^-$ type SiC epi layer 102 is formed to be embedded in the upper portion of n$^-$ type SiC epi layer 102. Then, for example, as in lateral MESFET 200 described above, a Schottky barrier is formed in the vicinity of a junction surface between n$^-$ type SiC epi layer 102 and gate electrode 122. The Schottky barrier is a depletion layer formed in n$^-$ type SiC epi layer 102 in the vicinity of the junction surface between gate electrode 122 and n$^-$ type SiC epi layer 102. In order to form the depletion layer resulting from this Schottky barrier in a deep region within n$^-$ type SiC epi layer 102, the structure is such that gate electrode 122 is embedded in n$^-$ type SiC epi layer 102.

The depletion layer (Schottky barrier) formed between gate electrode 122 on the left in FIG. 15 and n$^-$ type SiC epi layer 102 and the depletion layer formed between gate electrode 122 on the right and n$^-$ type SiC epi layer 102 are coupled and integrated with each other in the region under n$^+$ type source impurity region 111 in FIG. 15. Then, flow of electrons from source electrode 121 to drain electrode 124 is blocked and it becomes difficult to feed a current from source electrode 121 to drain electrode 124.

Then, a voltage positive with respect to the source is applied to gate electrode 122. Thus, height of the Schottky barrier above is lowered. Here, if the positive voltage is further increased, the depletion layer (Schottky barrier) disappears. Therefore, a current can flow from source electrode 121 to drain electrode 124 in accordance with a voltage across source electrode 121 and drain electrode 124.

As described above, in vertical MESFET 210 as well, magnitude of a current can be controlled by controlling a region of junction with n$^-$ type SiC epi layer 102, in accordance with a voltage applied to gate electrode 122.

A method of manufacturing vertical MESFET 210 basically conforms to the method of manufacturing vertical JFET 120. In forming gate electrode 122 embedded in a trench, n$^-$ type SiC epi layer 102 in that region is etched away, for example, with the RIE method. Then, gate electrode 122 can be formed with any conventionally well-known method for forming a thin film of metal such as a vacuum vapor deposition method.

In addition, in vertical MESFET 210 as well, a Schottky barrier is formed at the junction between gate electrode 122 and n$^-$ type SiC epi layer 102. Therefore, in vertical MESFET 210, a metal material capable of establishing Schottky contact with n$^-$ type SiC epi layer 102 while a voltage is not applied is preferably employed as a material for forming gate electrode 122. For source electrode 121 and drain electrode 124, however, a metal material capable of establishing ohmic contact with an SiC layer to be joined is preferably employed, as in the case of lateral JFET 100 and the like described above.

Vertical MESFET 210 formed in the procedure above includes substrate 101, in which bending at the time of formation of n$^-$ type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and vertical MESFET 210 having a dimension in accordance with a design value can be formed. Therefore, electrical characteristics such as a current-voltage characteristic in vertical MESFET 210 can be stable.

Present Example 5 is different from present Example 3 only in each point described above. Namely, present Example 5 fully conforms to present Example 3 in a configuration or a condition, a procedure, an effect, or the like that was not described above.

Example 6

Figure 16:
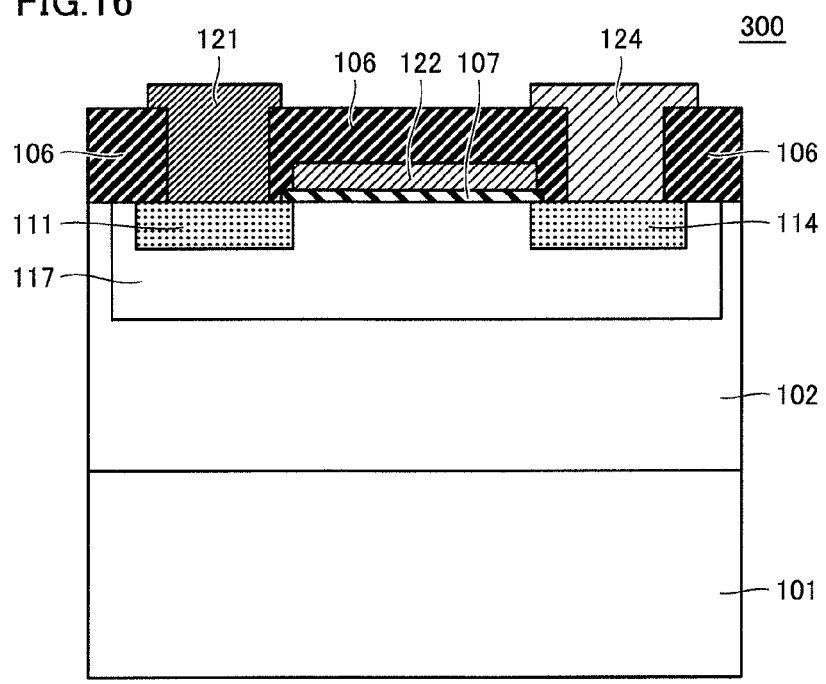
FIG. 16 is a schematic cross-sectional view showing a structure of a lateral MOSFET formed with the substrate according to the embodiment of the present invention.

A lateral MOSFET 300 shown in FIG. 16 includes a structure basically similar to that of lateral MESFET 200 shown in FIG. 14. Lateral MOSFET 300, however, has a p-type well region 117 formed in a region at a certain depth from the upper main surface of n$^-$ type SiC epi layer 102. N$^+$ type source impurity region 111 and n$^+$ type drain impurity region 114 are formed inside p-type well region 117. In addition, a gate insulating film 107 is arranged on a main surface of p-type well region 117 across n$^+$ type source impurity region 111 and n$^+$ type drain impurity region 114. Gate insulating film 107 is sandwiched between gate electrode 122 and p-type well region 117. In addition, lateral MOSFET 300 does not include substrate back electrode 127. It is noted that the p-type and the n-type of each component described above may all be reversed.

Lateral MOSFET 300 is different from lateral MESFET 200 only in the point above. It is noted that, preferably, gate insulating film 107 has a thickness, for example, of approximately 40 nm, and it is formed of a silicon oxide film ($SiO_2$) or a thin film composed of aluminum oxide ($Al_2O_3$), silicon nitride ($Si_3N_4$), silicon oxynitride (SiON), or the like. In addition, preferably, p-type well region 117 has a thickness of approximately 1.5 μm and contains aluminum as an impurity by approximately $1 \times 10^{16}$ cm$^{-3}$. Moreover, in lateral MOSFET 300, a polycrystalline thin film formed with a low-pressure CVD method (LPCVD method) is preferably employed as gate electrode 122.

An operation of lateral MOSFET 300 will now be described. For example, while a voltage is not applied to gate electrode 122, a potential difference is applied across source electrode 121 and drain electrode 124 such that electrons flow from source electrode 121 to drain electrode 124. Here, since n$^+$ type source impurity region 111 and n$^+$ type drain impurity region 114 are of the n-type and p-type well region 117 is of the p-type, a depletion layer is formed between n$^+$ type source impurity region 111 and p-type well region 117 or in any of p-type well region 117 and n$^+$ type drain impurity region 114. Therefore, smooth flow of a current between source electrode 121 and drain electrode 124 is difficult. If a negative voltage is applied to gate electrode 122, the depletion layer above further expands and hence flow of a current between source electrode 121 and drain electrode 124 becomes further difficult.

Here, a positive voltage is applied to gate electrode 122. Then, an inversion layer is formed in the vicinity of a surface of junction of p-type well region 117 to gate insulating film 107. Then, a depletion layer is not formed in a region extending from n$^+$ type source impurity region 111 to n$^+$ type drain impurity region 114.

Here, for example, a negative voltage is applied to source electrode 121 and a voltage higher than that for source electrode 121 but lower than that for gate electrode 122 is applied to drain electrode 124. Then, electrons supplied from source electrode 121 to n$^+$ type source impurity region 111 pass through the inversion layer between n$^+$ type source impurity region 111 and n$^+$ type drain impurity region 114 and reach n$^+$ type drain impurity region 114 and drain electrode 124. Therefore, a current can smoothly flow between source electrode 121 and drain electrode 124.

As shown above, in lateral MOSFET 300, a state in the vicinity of the junction surface of p-type well region 117 to gate insulating film 107 is controlled by changing voltage application to gate electrode 122. Thus, a current that flows from source electrode 121 to drain electrode 124 can be controlled. P-type well region 117 is provided, for example, in order to suppress flow of electrons supplied to n$^+$ type source impurity region 111 into n$^-$ type SiC epi layer 102 or n$^+$ type SiC substrate 101. As p-type well region 117 is present, detour and flow-in of electrons as above can be suppressed. Therefore, a value of a current from source electrode 121 to drain electrode 124 can more precisely be controlled by a voltage applied to gate electrode 122.

A method of manufacturing lateral MOSFET 300 will now be described. In the method of manufacturing lateral MOSFET 300, the step of forming p-type well region 117 and gate insulating film 107, which is not present in the method of manufacturing each semiconductor device described above, is present. P-type well region 117 can be formed, for example, with the ion implantation method, as in the case of various impurity regions described above. Here, the step of forming gate insulating film 107 in the step of forming a thin film composed of a material other than silicon carbide (S30) will be described.

As described above, gate insulating film 107 is a thin film made of an insulator arranged between gate electrode 122 which is a metal thin film and p-type well region 117 which is a semiconductor for such operations as formation of an inversion layer owing to electric field effect in the vicinity of the junction surface of p-type well region 117 described above. The step of forming this gate insulating film 107 is preferably performed after p-type well region 117, n$^+$ type source impurity region 111, and n$^+$ type drain impurity region 114 are formed. In addition, gate insulating film 107 is preferably formed so as to cover also a part of n$^+$ type source impurity region 111 and n$^+$ type drain impurity region 114. Thus, the inversion layer can readily be formed, for example, in the vicinity of the junction surface in the region of p-type well region 117 that lies between n$^+$ type source impurity region 111 and n$^+$ type drain impurity region 114.

For example, in forming a silicon oxide film as gate insulating film 107, the thermal oxidation method, in which a system including n$^+$ type SiC substrate 101 and n$^-$ type SiC epi layer 102 is subjected to heating treatment while oxygen is supplied to the inside of a heating furnace, is preferably employed. In this case, the silicon oxide film to serve as gate insulating film 107 can be formed, for example, by heating for 90 minutes at a temperature around 1150° C. It is noted that gate insulating film 107 may be formed, for example, by using the CVD method instead of the thermal oxidation method.

Lateral MOSFET 300 formed in the procedure above includes n$^+$ type SiC substrate 101, in which bending at the time of formation of n$^-$ type SiC epi layer 102 or other thin films, for example, a value for bow or warp, is not smaller than 0 µm and not greater than 150 µm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and lateral MOSFET 300 having a dimension in accordance with a design value can be formed. Therefore, electrical characteristics such as a current-voltage characteristic in lateral MOSFET 300 can be stable.

Present Example 6 is different from present Example 4 only in each point described above. Namely, present Example 6 fully conforms to present Example 4 in a configuration or a condition, a procedure, an effect, or the like that was not described above.

Example 7

Figure 17:
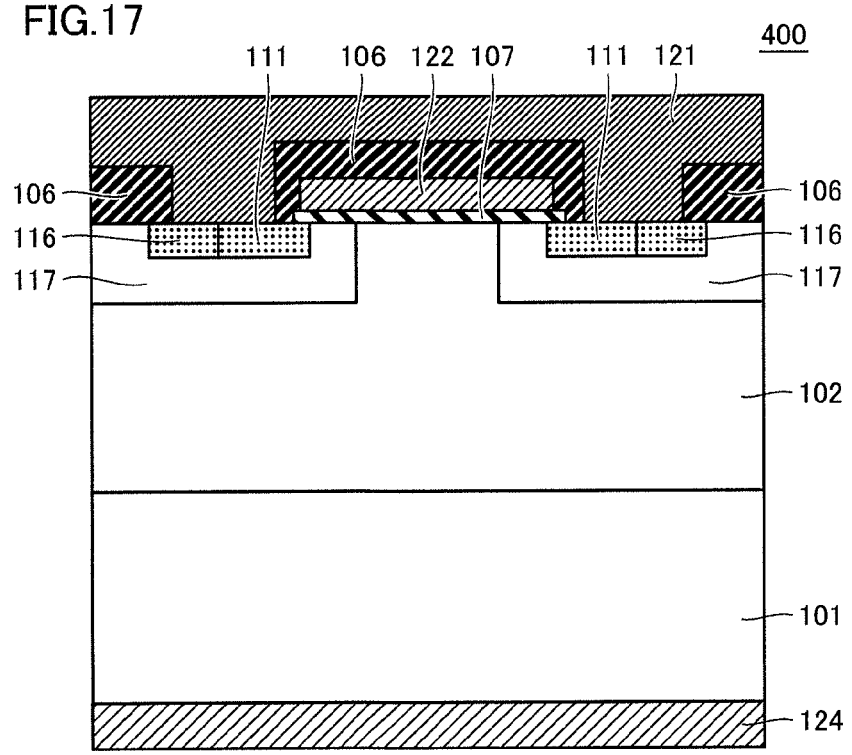
FIG. 17 is a schematic cross-sectional view showing a structure of a DMOS formed with the substrate according to the embodiment of the present invention.

A DMOS 400 shown in FIG. 17 represents one type of vertical MOSFETs. In lateral MOSFET 300 in FIG. 16 above, electrons flow from source electrode 121 to drain electrode 124 along gate insulating film 107, in the horizontal direction in the drawing. In contrast, in DMOS 400 in FIG. 17, electrons flow from source electrode 121 into a region of n$^-$ type SiC epi layer 102 opposed to gate insulating film 107 (upper portion in FIG. 17) and thereafter electrons are diverted to flow toward drain electrode 124. The DMOS is thus configured such that a current flows between source electrode 121 and drain electrode 124.

Specifically, as shown in FIG. 17, in regions electrically connected from a pair of source electrodes 121 present as a pair on the left and right sides to n$^-$ type SiC epi layer 102, p-type well regions 117 are provided respectively. P-type well region 117 contains n$^+$ type source impurity region 111 and a p$^+$ type well contact impurity region 116. Source electrode 121 is connected so as to cover both of n$^+$ type source impurity region 111 and p$^+$ type well contact impurity region 116. In order for electrons from source electrode 121 to flow toward drain electrode 124 in the vertical direction in the drawing, drain electrode 124 is arranged at a position, for example, the same as in vertical MESFET 210. It is noted that the p-type and the n-type of each component described above may all be reversed.

DMOS 400 is different from lateral MOSFET 300 only in the point above. It is noted that, preferably, p-type well region 117 has a thickness of approximately 1.5 µm and contains aluminum as an impurity by approximately $1 \times 10^{16}$ cm$^{-3}$, for example, as in lateral MOSFET 300 described above. Preferably, p$^+$ type well contact impurity region 116 contains aluminum as an impurity by approximately by $1 \times 10^{19}$ cm$^{-3}$ and has a thickness of approximately 0.4 µm.

An operation of DMOS 400 will now be described. If a voltage is not applied to gate electrode 122, in DMOS 400, conduction from source electrode 121 to drain electrode 124 is prevented either between n$^+$ type source impurity region 111 and p-type well region 117 or between p-type well region 117 and n$^-$ type SiC epi layer 102, because n$^+$ type source impurity region 111 is of the n-type, p-type well region 117 is of the p-type, and n$^-$ type SiC epi layer 102 is of the n-type. If a negative voltage is applied to gate electrode 122, a storage layer caused by holes of majority carriers is formed in p-type well region 117 covered with gate insulating film 107 under gate electrode 122. Therefore, flow of a current becomes further difficult.

If a positive voltage is applied to gate electrode 122, however, an inversion layer due to electrons is formed in p-type well region 117 covered with gate insulating film 107 under gate electrode 122. Therefore, a depletion layer is not formed in a region extending from n$^+$ type source impurity region 111 to drain electrode 124. Therefore, a current can flow between source electrode 121 and drain electrode 124 depending on a potential difference between these electrodes.

It is noted that p$^+$ type well contact impurity region 116 has a role to fix a potential at p-type well region 117 by electrically connecting source electrode 121 and p-type well region 117 to each other. As described above, impurity concentration in p-type well region 117 is as low as $1 \times 10^{16}$ cm$^{-3}$. Therefore, it is difficult to electrically connect p-type well region 117 and source electrode 121 to each other by directly joining the same. Then, in DMOS 400, p$^+$ type well contact impurity region 116 higher in impurity concentration than p-type well region 117, that is made of a p-type implantation layer identical in type to p-type well region 117, is arranged so as to join source electrode 121. Thus, source electrode 121 and p-type well region 117 can electrically be connected to each other through p$^+$ type well contact impurity region 116. Therefore, a potential of p-type well region 117 can be controlled based on a potential of source electrode 121. Thus, a withstand voltage, for example, in such a state that an inversion layer is not formed in p-type well region 117 and a current does not flow between source electrode 121 and drain electrode 124, can readily be controlled.

A method of manufacturing DMOS 400 will now be described. In the method of manufacturing DMOS 400, the step of forming p$^+$ type well contact impurity region 116, which is not present in the method of manufacturing each semiconductor device described above, is present. As shown in FIG. 17, p$^+$ type well contact impurity region 116 is formed with the ion implantation method in a region at a certain depth from the upper main surface of n$^-$ type SiC epi layer 102, for example, as in the case of n$^+$ type source impurity region 111. For example, as in the case of p-type gate impurity region 112 which is the p-type layer above, ions are preferably implanted to a concentration of approximately $1 \times 10^{19}$ cm$^{-3}$, for example, by using aluminum (Al), boron (B) or the like as an impurity. In addition, after ion implantation, in order to activate the impurity, annealing treatment is preferably performed.

As shown in FIG. 17, gate insulating film 107 is preferably formed to cover a part of p-type well region 117 and a part of n$^-$ type SiC epi layer 102 and n$^+$ type source impurity region 111. Thus, for example, when a positive voltage is applied to gate electrode 122, an inversion layer can reliably be formed in the vicinity of the junction surface of p-type well region 117.

DMOS 400 formed in the procedure above includes n$^+$ type SiC substrate 101, in which bending at the time of formation of n$^-$ type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and DMOS 400 having a dimension in accordance with a design value can be formed. Occurrence of such a defect as cut-off of a vertically continuous pathway of a current through source electrode 121 and drain electrode 124 due to overlapping of a pair of p-type well regions 117 or overlapping of p$^+$ type well contact impurity region 116 and n$^+$ type source impurity region 111, and the like, interval between which is narrow, can also be suppressed. Therefore, electrical characteristics such as a current-voltage characteristic in DMOS 400 can be stable.

Present Example 7 is different from present Example 6 only in each point described above. Namely, present Example 7 fully conforms to present Example 6 in a configuration or a condition, a procedure, an effect, or the like that was not described above.

Example 8

Figure 18:
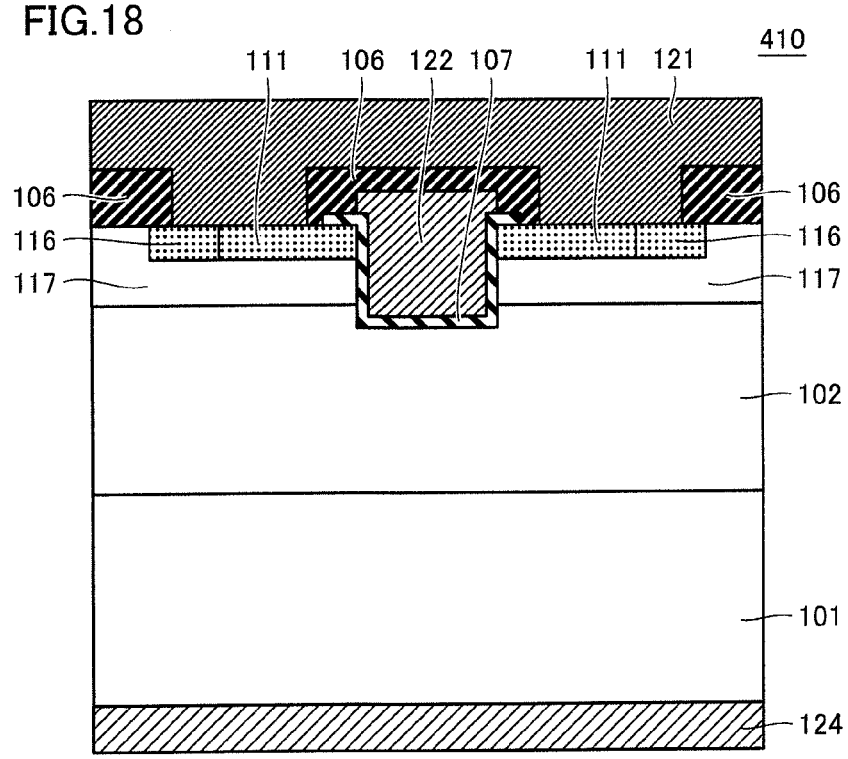
FIG. 18 is a schematic cross-sectional view showing a structure of a UMOS formed with the substrate according to the embodiment of the present invention.

A UMOS 410 shown in FIG. 18 includes a structure basically similar to that of DMOS 400 shown in FIG. 17. In UMOS 410, however, gate insulating film 107 is formed to cover a side surface of p-type well region 117, which extends in the vertical direction along the side of gate electrode 122 (inner side), and a bottom surface of gate electrode 122 extending in the horizontal direction in a lowermost portion thereof UMOS 410 is different from DMOS 400 only in the point above. It is noted that the p-type and the n-type of each component described above may all be reversed.

An operation of UMOS 410 will now be described. As in DMOS 400, an inversion layer due to electrons can be formed in accordance with voltage application to gate electrode 122, on the side surface (in the vicinity of the junction surface) of p-type well region 117 along gate insulating film 107. Then, in accordance with a potential difference between source electrode 121 and drain electrode 124, a current that has passed through n$^+$ type source impurity region 111, the inversion layer in p-type well region 117, n$^-$ type SiC epi layer 102, and n$^+$ type SiC substrate 101 can be applied across the electrodes above. The current between source electrode 121 and drain electrode 124 at this time flows along gate insulating film 107.

In a method of manufacturing UMOS 410, in the step of forming a thin film composed of silicon carbide (S20) shown in FIG. 8, after n$^-$ type SiC epi layer 102 is formed and p-type well region 117 as well as p$^+$ type well contact impurity region 116 and n$^+$ type source impurity region 111 are formed, a groove shape for forming gate insulating film 107 in a shape shown in FIG. 18 is formed. The groove above can be formed, for example, with the reactive ion etching method (RIE method). It is noted that a depth of the groove above in the vertical direction is preferably greater than a depth of p-type well region 117, in order to ensure conduction between source electrode 121 and drain electrode 124 as a result of formation of the inversion layer along the side surface of p-type well region 117. Then, gate insulating film 107 is formed on a surface of the groove formed with the method above, for example, with the thermal oxidation method, as in lateral MOSFET 300 and the like.

UMOS 410 formed in the procedure above includes n$^+$ type SiC substrate 101, in which bending at the time of formation of n$^-$ type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, such a defect as overlapping between adjacent patterns (source electrode 121 and gate electrode 122, and the like) can be suppressed and UMOS 410 having a dimension in accordance with a design value can be formed. Occurrence of such a defect as cut-off of a vertically continuous pathway of a current through source electrode 121 and drain electrode 124 due to overlapping between p+ type well contact impurity region 116 and n+ type source impurity region 111, and the like, interval between which is narrow, can also be suppressed. Therefore, electrical characteristics such as a current-voltage characteristic in UMOS 410 can be stable.

Present Example 8 is different from present Example 7 only in each point described above. Namely, present Example 8 fully conforms to present Example 7 in a configuration or a condition, a procedure, an effect, or the like that was not described above.

Example 9

Figure 19:
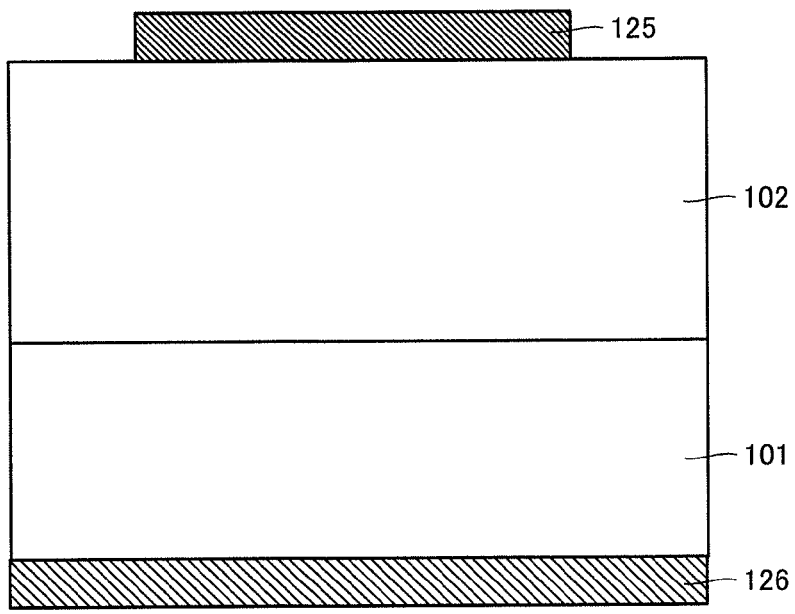
FIG. 19 is a schematic cross-sectional view showing a structure of a Schottky diode formed with the substrate according to the embodiment of the present invention.

A Schottky diode 500 shown in FIG. 19 is configured such that an anode electrode 125 is arranged on one main surface of a substrate with a thin film, in which n− type SiC epi layer 102 is formed on the main surface of n+ type SiC substrate 101 and a cathode electrode 126 is formed on the other main surface thereof. It is noted that the p-type and the n-type of each component described above may all be reversed. If the p-type and the n-type are reversed, locations where anode electrode 125 and cathode electrode 126 are arranged are interchanged as compared with the example in FIG. 19.

N+ type SiC substrate 101 is formed of a silicon carbide substrate of low resistance, having a thickness not smaller than 300 μm and not greater than 400 μm and a concentration of an impurity of nitrogen atoms of $1\times10^{19}$ cm$^{-3}$. N− type SiC epi layer 102 is a layer containing an impurity of nitrogen atoms by approximately $5\times10^{15}$ cm$^{-3}$ and having a thickness of approximately 10 μm. In addition, anode electrode 125 is made of a metal material capable of establishing Schottky contact with n− type SiC epi layer 102 while a voltage is not applied to the electrode. Cathode electrode 126 is made of a metal material capable of establishing ohmic contact with n+ type SiC substrate 101.

An operation of Schottky diode 500 will now be described. Anode electrode 125 in Schottky diode 500 has an effect, for example, similar to that of gate electrode 122 in lateral MESFET 200 described above. Namely, a Schottky barrier is formed in the junction between anode electrode 125 and n− type SiC epi layer 102. Therefore, for example, if a voltage is not applied to anode electrode 125 or a negative voltage is applied thereto, flow of a current between anode electrode 125 and cathode electrode 126 becomes difficult due to the presence of a depletion layer extending inside n− type SiC epi layer 102 due to the Schottky barrier above, even though a potential difference is provided across anode electrode 125 and cathode electrode 126.

Meanwhile, for example, if a positive voltage is applied to anode electrode 125, the Schottky barrier disappears depending on magnitude of the voltage and the depletion layer in n− type SiC epi layer 102 also disappears. Here, by applying a potential difference across anode electrode 125 and cathode electrode 126, a current can flow between these electrodes. Based on the principles above, Schottky diode 500 can have rectification property.

It is noted that Schottky diode 500 can be formed by forming a metal thin film or by using the photolithography technique, described as the step of forming a thin film composed of a material other than silicon carbide (S30) or the subsequent step of forming a semiconductor device (S40) in the method of manufacturing each semiconductor device described above.

Schottky diode 500 formed in the procedure above includes n+ type SiC substrate 101, in which bending at the time of formation of n− type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, electrical characteristics such as a current-voltage characteristic in Schottky diode 500 can be stable.

Example 10

Figure 20:
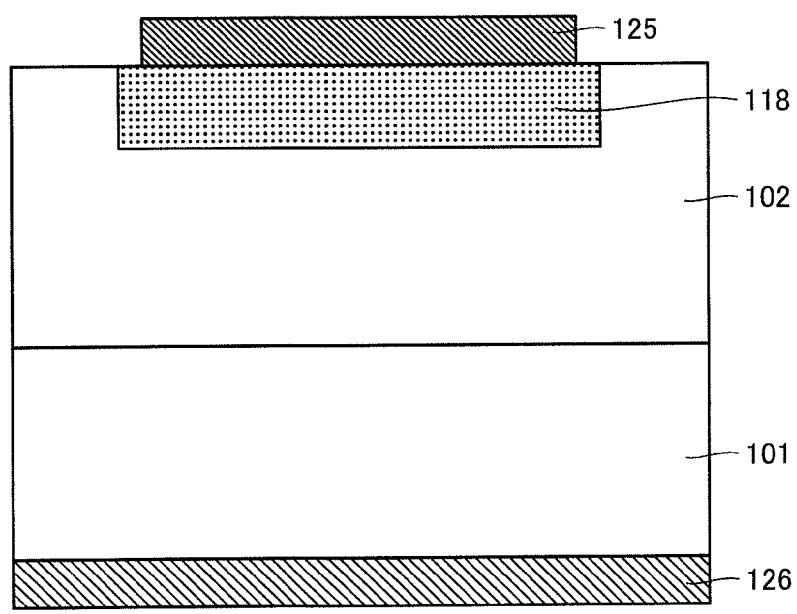
FIG. 20 is a schematic cross-sectional view showing a structure of a pin diode formed with the substrate according to the embodiment of the present invention.

A pin diode 510 shown in FIG. 20 includes a p+ type layer 118 opposite in type to n− type SiC epi layer 102 (for example, p-type, if n− type SiC epi layer 102 is the n-type) in a region of Schottky diode 500 shown in FIG. 19, at a certain depth from the main surface of n− type SiC epi layer 102. Then, anode electrode 125 and cathode electrode 126 both establish ohmic contact with an SiC layer to be joined while a voltage is not applied.

Pin diode 510 is different from Schottky diode 500 only in the point above. It is noted that the p-type and the n-type of each component described above may all be reversed. If the p-type and the n-type are reversed, locations where anode electrode 125 and cathode electrode 126 are arranged are interchanged as compared with the example in FIG. 20.

P+ type layer 118 is preferably an implantation layer containing aluminum as an impurity at high purity of approximately $1\times10^{19}$ cm$^{-3}$ and having a thickness of approximately 1.5 for example, similarly to p+ type gate impurity region 113 and the like described above.

An operation of pin diode 510 above will now be described. In a normal state, pin diode 510 is in a state close to an insulator because impurity concentration in n− type SiC epi layer 102 lying between p+ type layer 118 and n+ type SiC substrate 101 is low. Therefore, no current flows between the electrodes. In addition, even if a negative voltage is applied to anode electrode 125 and a positive voltage is applied to cathode electrode 126, a depletion layer expands in the vicinity of the junction surface between p+ type implantation layer 118 and n− type SiC epi layer 102 and thus a current is further less likely to flow between these electrodes.

For example, if a positive voltage is applied to anode electrode 125 and a negative voltage is applied to cathode electrode 126, the depletion layer in p+ type implantation layer 118 and n− type SiC epi layer 102 disappears. Then, migration of carriers therebetween is permitted and hence a current can flow between anode electrode 125 and cathode electrode 126.

In a method of manufacturing pin diode 510, p+ type implantation layer 118 should be formed. As shown in FIG. 20, p+ type implantation layer 118 is formed with the method of ion implantation into the region at a certain depth from the upper main surface of n− type SiC epi layer 102. For example, ions are preferably implanted to a concentration of approximately $1\times10^{19}$ cm$^{-3}$, for example, by using Al or B (boron) as an impurity.

Pin diode 510 formed in the procedure above includes n+ type SiC substrate 101, in which bending at the time of formation of n− type SiC epi layer 102 or other thin films, for example, a value for bow or warp, is not smaller than 0 μm and not greater than 150 μm. Therefore, occurrence of exposure variation in each formed pattern can be suppressed and a pattern having a high-quality edge portion can be obtained. Therefore, electrical characteristics such as a current-voltage characteristic in pin diode 510 can be stable.

Present Example 10 is different from present Example 9 only in each point described above. Namely, present Example 10 fully conforms to present Example 9 in a configuration or a condition, a procedure, an effect, or the like that was not described above.

Though embodiments and each example according to the present invention have been described above, it should be understood that the embodiments and each example disclosed herein are illustrative and non-restrictive in every respect. The scope of the present invention is defined by the terms of the claims, and is intended to include any modifications within the scope and meaning equivalent to the terms of the claims.

INDUSTRIAL APPLICABILITY

The present invention is particularly excellent as a technique for improving quality of a pattern forming a semiconductor device.

DESCRIPTION OF THE REFERENCE SIGNS 1, 101 substrate; 1a, 1b, 4a, 5a main surface; 2, 3 substrate with thin film; 4, 102 silicon-carbide thin film; 5 non-silicon-carbide thin film; 6, 7 suction force; 8 (0001) plane; 9 crystal plane; 10 hexagonal crystal; 11 three-point focal plane; 12 three-point focal plane height; 13 highest point; 14 lowest point; 15 central portion; 16 least square plane height; 80 CMP working apparatus; 85 workpiece; 87 base for polishing; 89 abrasive liquid; 90 both-side working apparatus; 93 rotation shaft; 95 surface plate base; 96 upper surface plate; 97 lower surface plate; 99 wafer carrier; 100 lateral JFET; 101 $n^+$ type SiC substrate; 102 $n^-$ type SiC epi layer; 103 $p^-$ type SiC substrate; 104 $p^-$ type SiC epi layer; 105 surface p-type layer; 106 interlayer insulating film; 107 gate insulating film; 110 RESURF lateral JFET; 111 $n^+$ type source impurity region; 112 p-type gate impurity region; 113 $p^+$ type gate impurity region; 114 $n^+$ type drain impurity region; 115 $p^+$ type embedded-connection impurity region; 116 $p^+$ type well contact impurity region; 117 p-type well region; 118 $p^+$ type implantation layer; 120 vertical JFET; 121 source electrode; 122 gate electrode; 124 drain electrode; 125 anode electrode; 126 cathode electrode; 127 substrate back electrode; 200 lateral MESFET; 210 vertical MESFET; 300 lateral MOSFET; 400 DMOS; 410 UMOS; 500 Schottky diode; and 510 pin diode.

The invention claimed is:

1. A substrate with a thin film, comprising:
   a substrate composed of silicon carbide and having a main surface having a diameter of 2 inches or greater; and
   a thin film composed of silicon carbide and formed on one said main surface, and
   a value for bow at said main surface being not smaller than −40 μm and not greater than 0 μm, and a value for warp at said main surface being not smaller than 0 μm and not greater than 40 μm.

2. The substrate with a thin film according to claim 1, wherein
   a value for surface roughness Ra of one main surface of said substrate is not greater than 1 nm and a value for surface roughness Ra of the other main surface opposed to said one main surface is not greater than 100 nm.

3. The substrate with a thin film according to claim 1, wherein
   a value for TTV at said main surface is not greater than 5 μm.

4. The substrate with a thin film according to claim 1, wherein
   an angle between said main surface and a C plane is not smaller than 50° and not greater than 65°.

5. A substrate with a thin film, comprising:
   a substrate composed of silicon carbide and having a main surface having a diameter of 2 inches or greater;
   a thin film composed of silicon carbide and formed on one said main surface; and
   a thin film composed of a material other than silicon carbide and formed on a main surface of said thin film composed of silicon carbide, which is not opposed to said substrate, and
   a value for bow at said main surface being not smaller than 0 μm and not greater than 150 μm, and a value for warp at said main surface being not smaller than 0 μm and not greater than 150 μm.

6. The substrate with a thin film according to claim 5, wherein
   a value for bow at said main surface is not smaller than 0 μm and not greater than 100 μm and a value for warp is not smaller than 0 μm and not greater than 100 μm.

7. The substrate with a thin film according to claim 5, wherein
   a value for surface roughness Ra of one main surface of said substrate is not greater than 1 nm and a value for surface roughness Ra of the other main surface opposed to said one main surface is not greater than 100 nm.

8. The substrate with a thin film according to claim 5, wherein
   a value for TTV at said main surface is not greater than 5 μm.

9. The substrate with a thin film according to claim 5, wherein
   an angle between said main surface and a C plane is not smaller than 50° and not greater than 65°.

10. A method of manufacturing a semiconductor device, comprising the steps of:
    preparing a substrate composed of silicon carbide and having a main surface having a diameter of 2 inches or greater;
    forming a thin film composed of silicon carbide on one said main surface of said substrate; and
    forming a thin film composed of a material other than silicon carbide on a main surface of said thin film, which is not opposed to said substrate,
    in said step of preparing a substrate, said substrate being prepared such that a value for bow at said main surface is not smaller than −40 μm and not greater than 0 μm and a value for warp at said main surface is not smaller than 0 μm and not greater than 40 μm,
    in said step of forming a thin film composed of silicon carbide, said thin film composed of silicon carbide being formed such that a value for bow at said main surface is not smaller than −40 μm and not greater than 0 μm and a value for warp at said main surface is not smaller than 0 μm and not greater than 40 μm, and
    in said step of forming a thin film composed of a material other than silicon carbide, said thin film composed of a material other than silicon carbide being formed such that a value for bow at said main surface is not smaller than 0 μm and not greater than 150 μm and a value for warp at said main surface is not smaller than 0 μm and not greater than 150 μm.

11. The method of manufacturing a semiconductor device according to claim 10, wherein
    in said step of preparing a substrate, said substrate is prepared such that a value for surface roughness Ra of one main surface of said main surfaces is not greater than 1 nm and a value for surface roughness Ra of the other main surface opposed to said one main surface is not greater than 100 nm.

12. The method of manufacturing a semiconductor device according to claim 10, wherein
in said step of forming a thin film composed of a material other than silicon carbide, a thin film of a metal or an insulating film is formed as said thin film composed of a material other than silicon carbide.

13. The method of manufacturing a semiconductor device according to claim 12, wherein
said metal is tungsten.

14. The method of manufacturing a semiconductor device according to claim 12, wherein
said insulating film is a silicon oxide film.

* * * * *